(12) United States Patent
Gädda et al.

(10) Patent No.: US 12,554,198 B2
(45) Date of Patent: Feb. 17, 2026

(54) FUNCTIONAL HYDROGEN SILSESQUIOXANE RESINS AND THE USE THEREOF

(71) Applicant: Pibond Oy, Espoo (FI)

(72) Inventors: Thomas Gädda, Espoo (FI); Luong Dang Nguyen, Espoo (FI); Markus Laukkanen, Espoo (FI); Kimmo Karaste, Espoo (FI); Oskari Kähkönen, Espoo (FI); Juha Rantala, Espoo (FI)

(73) Assignee: Pibond Oy, Espoo (FI)

( * ) Notice: Subject to any disclaimer, the term of this patent is extended or adjusted under 35 U.S.C. 154(b) by 1150 days.

(21) Appl. No.: 17/433,630

(22) PCT Filed: Feb. 25, 2020

(86) PCT No.: PCT/FI2020/050121
§ 371 (c)(1),
(2) Date: Aug. 25, 2021

(87) PCT Pub. No.: WO2020/174126
PCT Pub. Date: Sep. 3, 2020

(65) Prior Publication Data
US 2022/0162391 A1    May 26, 2022

(30) Foreign Application Priority Data
Feb. 25, 2019  (FI) ...................... 20195142

(51) Int. Cl.
*C08G 77/12* (2006.01)
*C08G 77/04* (2006.01)
(Continued)

(52) U.S. Cl.
CPC ......... *G03F 7/0757* (2013.01); *C08G 77/045* (2013.01); *C08G 77/12* (2013.01);
(Continued)

(58) Field of Classification Search
CPC ....... G03F 7/0757; C08G 77/12; C08G 77/20; C08G 77/24
See application file for complete search history.

(56) References Cited

U.S. PATENT DOCUMENTS 2,973,095 A    2/1961  Sayers et al.
5,063,267 A *  11/1991 Hanneman ........ H01L 21/02134
                                                423/325
(Continued)

FOREIGN PATENT DOCUMENTS

CN    1871550 A    11/2006
CN    101048704 A  10/2007
(Continued)

OTHER PUBLICATIONS

De Simone et al: Photoresists in extreme ultraviolet lithography (EUVL). Adv. Opt. Technol., 2017, vol. 6, pp. 163-172.
(Continued)

*Primary Examiner* — John S. Chu
(74) *Attorney, Agent, or Firm* — Laine IP Oy

(57) ABSTRACT

Carbon-carbon unsaturated bond containing, halogen containing, and solubility-enhancer containing coatings on semiconductor substrates for forming patterns thereon. The present coatings can be produced by coating of semiconductor substrates with carbon-carbon unsaturated bond-containing, halogen-containing, and solubility-enhancer containing polyhydrogensilsesquioxane resin solutions. Provided herein is also a method for patterning substrate coating of a polyhydrogensilsesquioxane containing a carbon-carbon unsaturated bond, halogen, and solubility-enhancer with radiation of light, the method comprising the steps of irradiating a coated substrate along a selected pattern to form an irradiated structure with a region of irradiated coating and a region with un-irradiated coating
(Continued)

and selectively developing the irradiated structure to remove a substantial portion of the un-irradiated coating to form a patterned substrate.

19 Claims, 6 Drawing Sheets

(51) Int. Cl.
 *C08G 77/20* (2006.01)
 *C08G 77/24* (2006.01)
 *G03F 7/075* (2006.01)
 *G03F 7/20* (2006.01)

(52) U.S. Cl.
 CPC ............ *C08G 77/20* (2013.01); *C08G 77/24* (2013.01); *G03F 7/0755* (2013.01); *G03F 7/2004* (2013.01)

(56) References Cited

U.S. PATENT DOCUMENTS

| | | | | |
|---|---|---|---|---|
| 5,416,190 | A | * | 5/1995 | Mine .................... C08G 77/36 528/492 |
| 5,486,564 | A | * | 1/1996 | Mine .................... C08G 77/12 524/588 |
| 5,973,095 | A | | 10/1999 | Hacker et al. |
| 6,197,913 | B1 | * | 3/2001 | Zhong .................. C09D 183/14 528/31 |
| 2003/0108812 | A1 | | 6/2003 | Rottstegge et al. |
| 2005/0003215 | A1 | * | 1/2005 | Hacker ................. C08G 77/08 428/447 |
| 2007/0281242 | A1 | * | 12/2007 | Hu ....................... G03F 7/0757 430/327 |
| 2009/0220889 | A1 | | 9/2009 | Sato et al. |
| 2010/0007025 | A1 | | 1/2010 | Nakagawa et al. |
| 2011/0311781 | A1 | | 12/2011 | Darnon et al. |
| 2012/0118856 | A1 | | 5/2012 | Fu et al. |
| 2014/0023970 | A1 | | 1/2014 | Fu et al. |
| 2014/0213809 | A1 | * | 7/2014 | Kusunoki ............ C08G 77/045 556/451 |
| 2018/0066159 | A1 | * | 3/2018 | Karkkainen ......... C09D 183/14 |

FOREIGN PATENT DOCUMENTS

| | | |
|---|---|---|
| CN | 102245674 A | 11/2011 |
| CN | 102439523 A | 5/2012 |
| CN | 103460135 A | 12/2013 |
| CN | 109071576 A | 12/2018 |
| CN | 109072039 A | 12/2018 |
| EP | 0725106 A2 | 8/1996 |
| EP | 0798341 A1 | 10/1997 |
| JP | 2006117846 A | 5/2006 |
| JP | 2006143835 A | 6/2006 |
| JP | 2006169391 A | 6/2006 |
| JP | 2006177989 A | 7/2006 |
| JP | 2007154047 A | 6/2007 |
| JP | 2014510955 A | 5/2014 |
| JP | 2019001961 A | 1/2019 |
| TW | 201807492 A | 3/2018 |
| WO | WO03044078 A1 | 5/2003 |
| WO | WO2006049720 A1 | 5/2006 |
| WO | WO2011011140 A2 | 1/2011 |
| WO | WO2012154316 A1 | 11/2012 |
| WO | WO2016208300 A1 | 12/2016 |

OTHER PUBLICATIONS

De Simone et al: Progresses and Challenges of EUV Lithography Materials. J. Photopolym. Sci. Technol., 2014, vol. 27, pp. 601-610.
Gangnaik et al: New Generation Electron Beam Resists: A Review. Chem. Mater., 2017, vol. 29, pp. 1898-1917.
Grigorescu et al: Resists for sub-20-nm electron beam lithography with a focus on HSQ: State of the art. Nanotechnology, 2009, vol. 20.
Higgins et al: Resolution, line-edge roughness, sensitivity tradeoff, and quantum yield of high photo acid generator resists for extreme ultraviolet lithography. J. Appl. Phys., 2011, vol. 50, pp. 1-8.
Okoroanyanwu. Molecular Theory of Lithography, 2015, SPIE Press.
Watanabe: Current status and prospect for EUV lithography. 2017 7th Int. Conf. Integr. Circuit, Des. Verif., 2017, pp. 3-8.
Yang et al: Understanding of hydrogen silsesquioxane electron resist for sub-5-nm-half-pitch lithography. J. Vac. Sci. Technol. B Microelectron Nanom. Struct., 2009, vol. 27.

* cited by examiner 1) condensation

2) Double bond polymerization: methacrylate polymerization

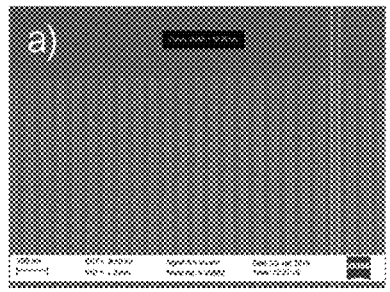 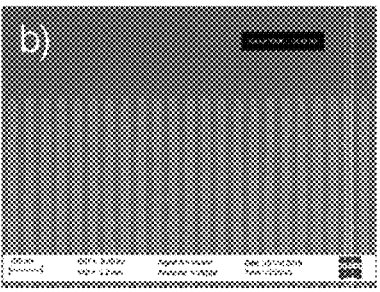 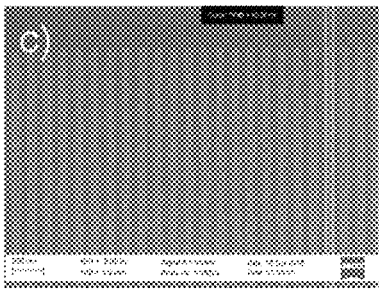
Fig. 5A    Fig. 5B    Fig. 5C
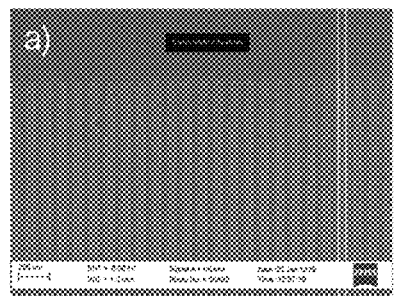 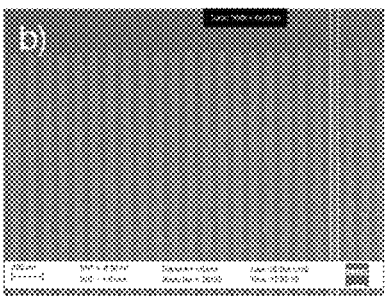 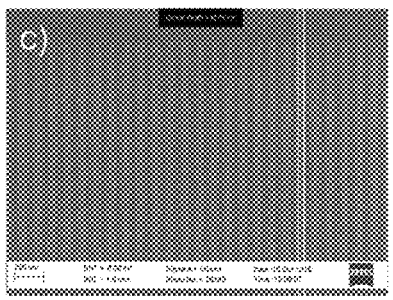
Fig. 6A    Fig. 6B    Fig. 6C
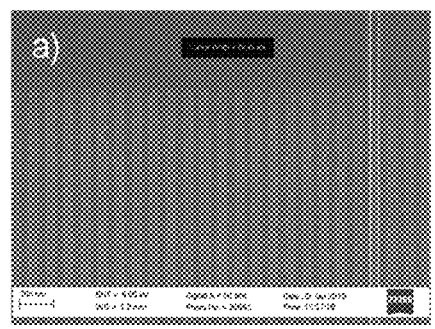 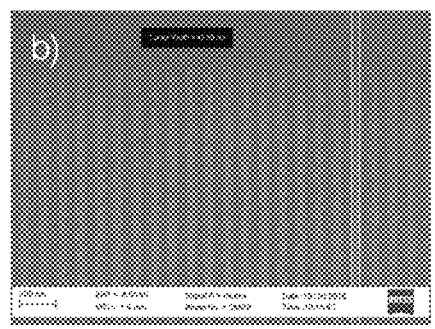
Fig. 7A    Fig. 7B

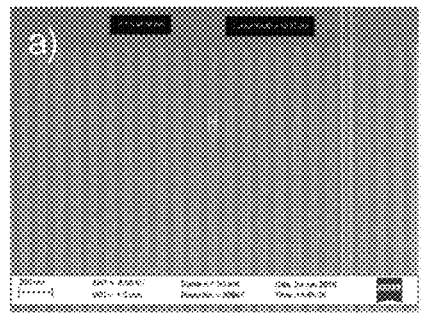 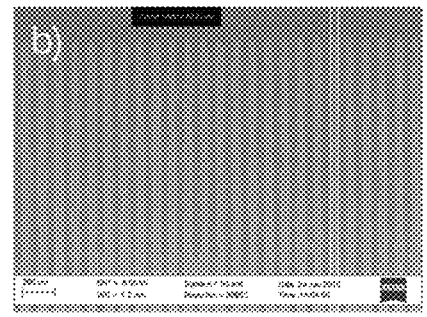
Fig. 8A            Fig. 8B
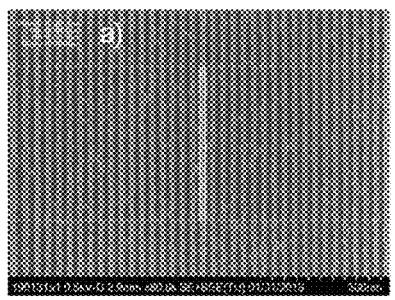 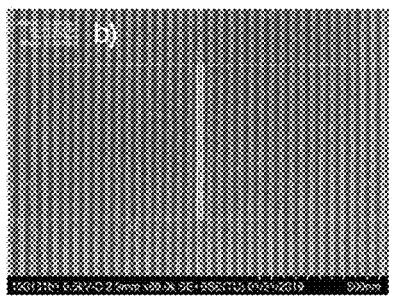 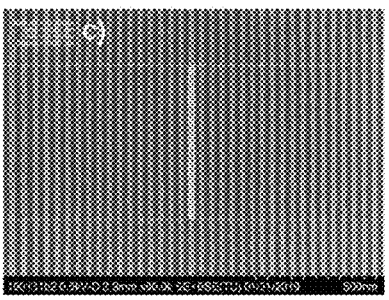
Fig. 9A            Fig. 9B            Fig. 9C
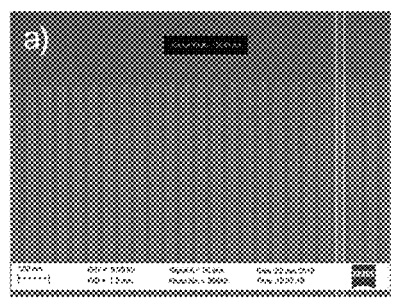 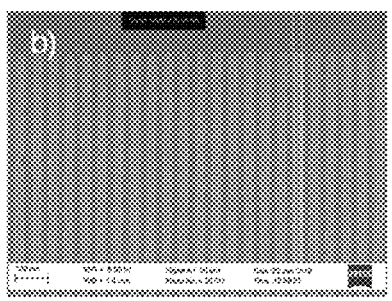 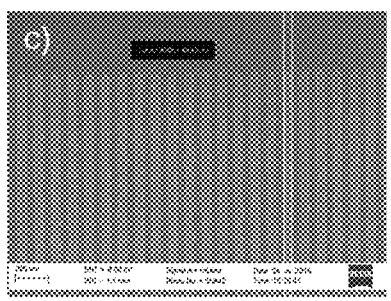
Fig. 10A           Fig. 10B           Fig. 10C

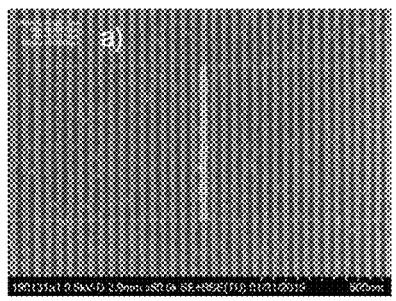 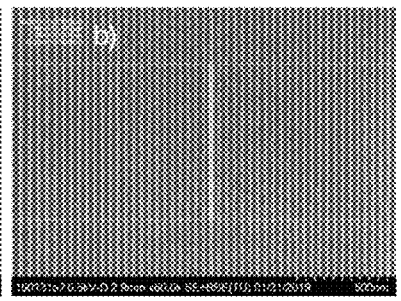 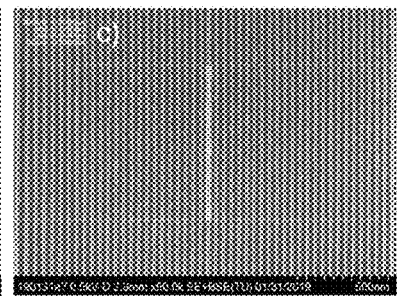
Fig. 11A    Fig. 11B    Fig. 11C
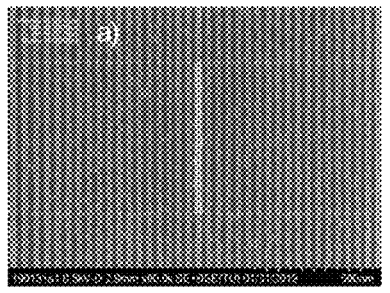 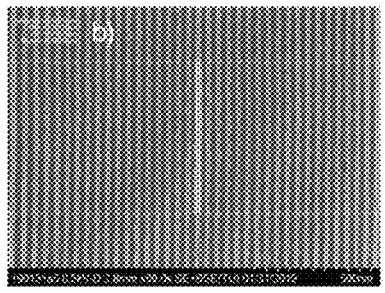 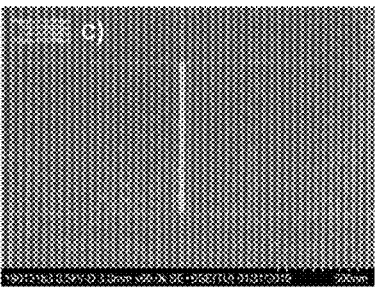
Fig. 12A    Fig. 12B    Fig. 12C

FUNCTIONAL HYDROGEN SILSESQUIOXANE RESINS AND THE USE THEREOF

FIELD OF THE INVENTION

The invention relates to radiation-based methods to perform a patterning step on a substrate using functionalized polyhydrogensilsesquioxane resin coating compositions.

The invention further relates to one or more hydrolyzed precursors in solutions that can be deposited as functionalized polyhydrogensilsesquioxane to resin coatings that can be patterned with very high resolution directly or by applying a masked radiation and to coated substrates and coatings formed with the precursor solutions before and after patterning.

BACKGROUND

The industry has transitioned through general exposure tools to defined wavelengths from 436 nm (g-line), 405 nm (h-line), 365 nm (i-line), 248 nm (KrF excimer) and finally 193 nm (ArF excimer) (Okoroanyanwu 2015, Gangnaik et al. 2017, De Simone et al. 2014).

The resist material used at 248 nm and 193 nm wavelengths are chemically amplified resists (CAR), whose composition and microstructure has evolved following needs in printing ever finer features on substrates. As a continuation of this trend, extreme ultraviolet (EUV) wavelength of $\lambda=13.5$ nm (92 eV) is the major candidate for the next-generation lithography (De Simone et al. 2017).

In the last decade, significant investment has been made in the development of EUV lithography (EUVL) for mass production of integrated circuits. There are various nanolithography techniques including electron beam lithography (EBL), soft lithography, nanoimprint lithography (NIL), photon beam lithography (PBL), or scanning probe lithography proposed to extend the scaling down of the features that can be printed on a two-dimensional surface.

Success of EUVL requires new photoresist materials which all encounter certain benefits and drawbacks. Functional photoresists should provide the RLS characteristics, that is, resolution (R), line-edge roughness (LER), and sensitivity (S) as described by Higgins et al. 2011.

There are a myriad of different material approaches that have been developed to form patterns using EUVL. On a general level these can be classified in three different categories: organic, silicon based and metal containing resists.

Organic resists, often referred as non-CAR resists, can demonstrate sufficient LER but are in great disadvantage due to the need of high doses resulting from poor EUV absorption characteristics. To increase the sensitivity of the resists, CAR materials have been employed. CAR materials on the other hand suffer from poor LER resulting mainly from statistical effects of photon shot noise and photo-acid generator distribution in the CAR.

To address the challenges of both organic type resists, formulations have been prepared with radiation sensitive components included in the resist material. Elements which have high molar absorptivity of 13.5 nm EUV photons are metals. Thus, there has been an increasing interest in metal containing resists where the metal is added to other resist materials to improve sensitivity, or the metals have been employed as molecular resists, metal oxide nanoparticle, organometallic precursors or as metal-organic frameworks.

Such resists have shown high sensitivity, resolution and thus are being considered as key candidates for future EUVL resists. However, their main disadvantage is that metals are strongly disfavored in fabrication of integrated circuits as they can disrupt the function of transistors, and that LER characteristics require improvement. Furthermore, De Simone et al. and Watanabe note that in EUV scanner, the metal species in metal-containing resists interact with atomic H or radical H* form metallic hydrides (MxHy) that is a serious risk to optics lifetime. In addition, high LER is a problem in both metal-based and chemically amplified resists (De Simone et al. 2017).

Another disadvantage of CAR is low etch resistance and instability of the pattern (Grigorescu and Hagen 2009). Thus, a CAR requires both a silicon rich middle layer and a carbon rich underlayer for pattern transfer to substrate. Inorganic resins based on metal and silicon have the benefit that the lithographic stack is simplified as the inorganic middle layer is directly patterned by EUVL.

Hydrogen silsesquioxane (HSQ) is a widely utilized negative-type electron-beam and EUVL resist material. Due to its potential for high density patterns, namely, less than 10 nm pitch structures, intensive investigations have been carried out to find an optimum process. However, it suffers from very low sensitivity, requires concentrated developers and is known to be relatively unstable during processing rendering its industrial adoption limited as described by (Yang et al. 2009).

There are several factors which can facilitate to develop a process suitable for EUVL such as developer temperature, developer concentration and developer composition. Despite the advances in prior art, functional photoresists that provide the RLS characteristics without excessive metal contamination is still being looked for.

SUMMARY OF THE INVENTION

It is an object of the present invention to provide novel functional polyhydrogensilsesquioxane resin coating compositions.

It is another object of the present invention to provide methods of producing novel functional hydrogen silsesquioxane resins.

It is a third object of the present invention to provide methods for patterning of functional polyhydrogensilsesquioxane coated substrates with radiation of light.

It is a further object of the present invention to provide coated substrates comprising radiation sensitive coatings suitable for patterning by radiation of light or electron beams.

As further object, the invention pertains to a method for patterning a carbon-carbon unsaturated bond and/or halogen-containing bond containing polyhydrogensilsesquioxane coated substrate with radiation of light at a specific wavelength, the method comprising the steps of irradiating a coated substrate along a selected pattern to form an irradiated structure with a region of irradiated coating and a region with un-irradiated coating and selectively developing the irradiated structure to remove a substantial portion of the un-irradiated coating to form a patterned substrate. The coated substrate generally comprises a coating used for pattern formation that comprises a silicon-oxygen network with silicon-carbon bonds and silicon-hydrogen and/or with carbon-carbon unsaturated bond and/or halogen-containing bonds.

As a one more object, the invention pertains to a method for patterning a carbon-carbon unsaturated bond and/or halogen-containing bond polyhydrogensilsesquioxane coated substrate with radiation of light at a specific wavelength, wherein the wavelength is 13.5 nm or less.

As another object, the invention pertains to a coated substrate comprising a radiation sensitive coating having an average thickness of no more than about 5 microns and a thickness variation of no more than about 50% from the average at any point along the coating, the coating comprising a silicon-oxygen network with silicon-carbon bonds and silicon-hydrogen and/or with carbon-carbon unsaturated bond and/or halogen-containing bonds.

Another object of the invention pertains to a patterned substrate comprising a substrate with a surface and a first coating at selected regions along the surface and absent at other regions along the surface. Generally, the first coating comprises a silicon-oxygen network with silicon-carbon bonds and silicon-hydrogen and/or carbon-carbon unsaturated bond and/or halogen-containing bonds. Alternatively, the first coating is soluble in at least some organic liquids, or the first coating is soluble in aqueous bases.

As an additional object, the invention pertains to a precursor solution comprising an organic liquid and from about 0.001M to about 1M carbon-carbon unsaturated bond compared to Si—H or Si—R in silicon-oxygen network silicon-carbon bonds and silicon-hydrogen, and the precursor solution having a viscosity from about 0.5 centipoises (cP) to about 150 cP. The organic liquid can have a flash point of at least 10° C. and a vapor pressure at 20° C. of less than about 10 kPa.

As one more object, the invention pertains to a patterned substrate comprising a substrate with a surface and a first coating at selected regions along the surface and absent at other regions along the surface. Generally, the first coating comprises a silicon-oxygen network with silicon-carbon bonds and silicon-hydrogen and/or with carbon-carbon unsaturated bonds, and has an etch rate in an oxygen plasma or ashing process lower than 50 nm/min. One last object of the invention is the ability to alter the solubility of the coating comprising silicon-oxygen network with silicon-carbon bonds and silicon-hydrogen and/or with carbon-carbon unsaturated bond and/or halogen-containing bonds by methods of copolymerization of precursors either restricting or facilitating the solubility of the coating to a developer.

Conventional HSQ resins are free from silanol functionality. In our co-pending invention (FI patent application 20185677) it is shown that the presence of silanol moieties in an HSQ resin enhances the pattern forming ability of the coatings compared to HSQ resins.

As a result, a silanol-containing polyhydrogensilsesquioxane demonstrates higher sensitivity in EUV lithography compared to those described in literature to date.

Further, provided herein are polyhydrogensilsesquioxane resins having a network with silicon-carbon bonds and silicon-hydrogen in combination with carbon-carbon unsaturated bond(s), halogen-containing bond(s), and solubility enhancing groups or combinations thereof.

It would appear that silanol groups of the resin, present in the film, react with intermediate reactive silicon species generated by EUV from SiH, but this is merely one possible explanation.

Further, it has been found that the addition of functionalized groups further enhanced the sensitivity of the polyhydrogensilsesquioxane resin. Addition of silicon containing precursors containing functional groups such as unsaturated bonds or halogen atoms further enhances the sensitivity of the resin and enables a wider process margin or window.

Similarly, silicon containing precursors containing functional groups that enhances solubility in aqueous developers can further improve pattern formation and compounds to a wider process margin.

These solutions can be used for producing cast silanol-containing functional organic-inorganic hybrid coatings on semiconductor substrates for forming patterns thereon.

The invention also provides a coated substrate comprising a radiation sensitive coating, comprising silicon-oxygen network with functional silicon-carbon bonds and silicon-hydrogen and/or with silanol bonds.

The invention further provides a method for patterning a functional polyhydrogensilsesquioxane coated substrate with radiation of light at a specific wavelength or electron beams, the method comprising the steps of irradiating a coated substrate along a selected pattern to form an irradiated structure with a region of irradiated coating and a region with un-irradiated coating and selectively developing the irradiated structure to remove a substantial portion of the un-irradiated coating to form a patterned substrate.

Further, the invention provides a method for patterning a functional polyhydrogensilsesquioxane coated substrate with radiation of light at a specific wavelength, wherein the wavelength is 13.5 nm or less.

Still further, the invention provides a patterned substrate comprising a substrate with a surface and a first coating at selected regions along the surface and absent at other regions along the surface. Generally, the first coating comprises a functional polyhydrogensilsesquioxane with silicon-carbon bonds and silicon-hydrogen and/or with silanol bonds. Alternatively, the first coating is soluble in at least some organic liquids, or the first coating is soluble in aqueous bases.

More specifically, the present invention is characterized by what is stated in the characterizing part of the independent claims.

Considerable advantages are obtained by the present invention.

The invention described herein addresses key challenges in patterning of sub 20 nm features. In addition, materials described offer high oxygen plasma etch resistance making the simplification of the lithographic stack possible. Additionally, to our surprise, the use of coatings comprising a polyhydrogensilsesquioxane resin network with silicon-carbon bonds and silicon-hydrogen present in combination with carbon-carbon unsaturated bond and/or halogen-containing bond and/or solubility enhancing group permits the use of industry standard 2.38 wt-% TMAH solutions to develop the patterns with means to engineer the solubility characteristics of the irradiated coating to the developer.

Thus, the present solutions can be used to cast coatings on semiconductor substrates to form patterns through subsequent bake, irradiation and development steps. In particular, the invention allows for the controlling of the microstructure of the resin in such way it is industrially feasible and solves the drawbacks of prior art. For instance, the functional polyhydrogensilsesquioxane resin composition can be adjusted to impart higher sensitivity and wider process window, which is highly desirable to obtained highly sensitive coating for application in EUVL.

The invention described herein addresses key RLS challenges, and in addition offers high oxygen plasma etch resistance making the simplification of the lithographic stack possible.

Additionally, the use of coatings comprising a functional polyhydrogensilsesquioxane with silicon-oxygen, or silicon-oxygen-metal network with silicon-carbon bonds and silicon-hydrogen and/or with silanol bonds permits the use of industry standard 2.38 wt-% TMAH solutions to develop the patterns with means to engineer the solubility characteristics of the irradiated coating to the developer.

Photoinitiators or photocatalysts are used in conventional polyhydrogensilsesquioxane resins. Examples of such components are the following: benzophenone, methyl-2-benzoylbenzoate, 2-hydroxy-2-methyl-1-phenyl-1-propanone, 1-hydroxy-cyclohexyl-phenyl-ketone, mixture of mixture of oxy-phenyl-acetic acid 2-[2-oxo-2-phenyl-acetoxy-ethoxy]-ethyl ester and oxy-phenyl-acetic acid 2-[2-hydroxy-ethoxy]-ethyl ester, ethyl-2,4,6-trimethylbenzoylphenyl phosphinate, diphenyl(2,4,6-trimethylbenzoyl)-phosphine oxide and mixtures thereof. Surprisingly it has been found that photoinitiators or photocatalysts do not need to be used, at all, in the present technology. Rather, the present compositions that can be cured without photocatalysts. Thus, the present compositions will provide for coatings that can be subjected to patterning carried out without any photoinitiators present.

Further features and advantages of the present technology will appear from the following detailed discussion of embodiments.

BRIEF DESCRIPTION OF THE DRAWINGS

FIGS. 5A, 5B and 5C show SEM images for e-beam treatment results obtained in a) Comparative Example 1, b) Example 1, and c) Example 2;

FIGS. 6A, 6B and 6C show SEM images for e-beam treatment results obtained in a) Comparative Example 1, b) Example 2, and c) Example 3;

FIGS. 7A and 7B show SEM images for e-beam treatment results obtained in a) Comparative Example 1 and b) Example 4;

FIGS. 8A and 8B show SEM images for e-beam treatment results obtained in a) Example 5 and b) Comparative Example 2;

FIGS. 9A 9B and 9C are SEM images showing e-beam result of 22 nm half pitch patterned lines obtained by EUVL using materials in a) Comparative Example 1 exhibiting LER=3.87 nm, b) Example 6 exhibiting LER=2.86 nm, and Example 7 exhibiting LER=2.77 nm; where the applied EUV doses were 77.5 mJ/cm$^2$, 97.5 mJ/cm$^2$ and 82.5 mJ/cm$^2$, respectively;

FIGS. 10A, 10B and 10C show SEM images for e-beam treatment results obtained in a) Comparative Example 1, b) Example 8, and c) Example 9;

FIGS. 11A, 11B and 11C are SEM images showing e-beam result of 22 nm half pitch patterned lines obtained by EUVL using materials in a) Comparative Example 1 exhibiting LER=3.87 nm, b) Example 10 exhibiting LER=2.80 nm, and Example 11 exhibiting LER=3.05 nm; where the applied EUV doses were 77.5 mJ/cm$^2$, 87.5 mJ/cm$^2$ and 107.5 mJ/cm$^2$, respectively;

FIGS. 12A, 12B and 12C are SEM images showing e-beam result of 22 nm half pitch patterned lines obtained by EUVL using materials in a) Comparative Example 1 exhibiting LER=3.87 nm, b) Example 10 exhibiting LER=4.96 nm, and Example 11 exhibiting LER=3.00 nm; where the applied EUV doses were 77.5 mJ/cm$^2$, 87.5 mJ/cm$^2$ and 90 mJ/cm$^2$, respectively.

EMBODIMENTS

Figure 1:
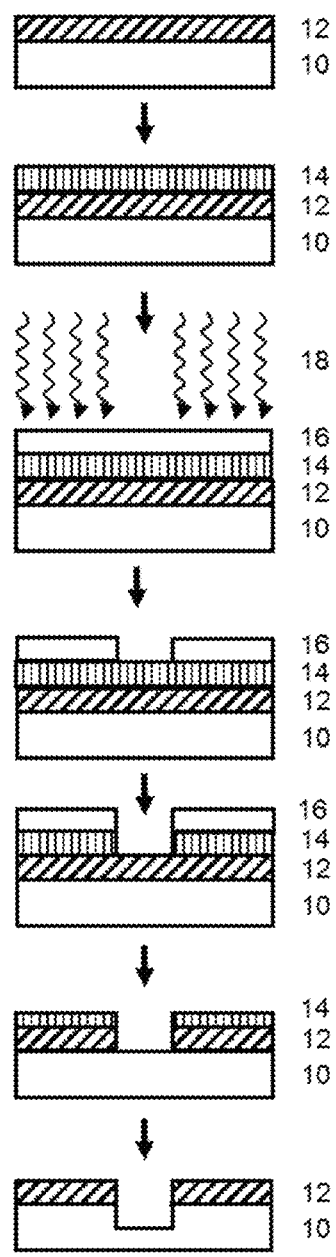
FIG. 1 shows in a schematic fashion, in side-view, the assembly of a trilayer lithography stack.

Unless otherwise stated herein or clear from the context, any percentages referred to herein are expressed as percent by weight based on a total weight of the respective composition.

Unless otherwise stated, properties that have been experimentally measured or determined herein have been measured or determined at room temperature. Unless otherwise indicated, room temperature is 25° C.

It must also be noted that, as used in the specification and the appended claims, the singular forms "a," "an" and "the" include plural referents unless otherwise specified.

As used herein, the term "about" refers to a value which is ±5% of the stated value. As used herein, the term "about" refers to the actual given value, and also to an approximation to such given value that would reasonably be inferred to one of ordinary skill in the art, including approximations due to the experimental and/or measurement conditions for such given value.

Unless otherwise stated, the term "molecular weight" or "average molecular weight" refers to weight average molecular weight (also abbreviated "$M_w$").

Embodiments of the present invention relates to a method of manufacturing functional polyhydrogensilsesquioxane resin solutions where in hydrolyzable silicon precursors are subjected to controlled hydrolysis/condensation reactions alone or with suitable other silicon containing precursors.

As will appear from the following, the present technology provides carbon-carbon unsaturated bond containing, halogen containing, and solubility-enhancer containing coatings on semiconductor substrates for forming patterns thereon. The present coatings can be produced by coating of semiconductor substrates with carbon-carbon unsaturated bond-containing, halogen-containing, and solubility-enhancer containing polyhydrogensilsesquioxane resin solutions.

Described in more detail are also embodiments comprising methods for patterning a carbon-carbon unsaturated bond-containing, halogen-containing, and solubility-enhancer containing polyhydrogensilsesquioxane coated substrate with radiation of light at a specific wavelength. Typically, embodiments of the method comprise the steps of irradiating a coated substrate along a selected pattern to form an irradiated structure with a region of irradiated coating and a region with un-irradiated coating and selectively developing the irradiated structure to remove a substantial portion of the un-irradiated coating to form a patterned substrate.

The present materials can be characterized as "functional polyhydrosilsesquioxane resins". Such materials contain residues derived from organic compounds as well as from inorganic compounds, as will be explained below. Further, the present materials contain silanol groups, i.e. groups exhibiting the connectivity Si—O—H, and other functional groups exhibiting connectivity to Si, typically along its main chain, in particular along its main siloxane chain.

The term "functional" Is used, for example, for indicating that the novel polyhydrogensilsesquioxane polymers exhibit "functionalities", i.e. groups capable of reacting. Such functional groups will contribute to the properties of the resins and/or of the coatings prepared from the resins.

More specifically, the functional groups in the present invention related to polyhydrogensilsesquioxane resin relate to hydrocarbyl radical connected to silicon atoms in the resin containing carbon-carbon unsaturated bonds, which when present in even small quantities can greatly improve the pattern formation on a substrate.

Embodiments of this invention also related the functional groups in the present invention related to polyhydrogensilsesquioxane resin relate to hydrocarbyl radical connected to silicon atoms in the resin containing halogen atoms, which when present in even small quantities further improve the pattern formation on a substrate by enhancing the absorption of the resin.

More specifically, the functional groups in the present invention related to polyhydrogensilsesquioxane resin relate to hydrocarbyl radical connected to silicon atoms in the resin containing a solubility enhancing group, which when present in even small quantities can greatly improve the pattern formation on a substrate by yielding a better dissolution of non-exposed areas to the developer.

The silicon content of the resins or the coatings is typically at least 30%, in particular 35% by weight or more, and can even reach a value of ~52% by weight. In one embodiment, the composition has a silicon content of more than 35% by weight based on the total weight of the composition.

Generally, there is about 70-99% Si—H groups per repeating unit of the polyhydrogensilsesquioxane resin main chain. In one embodiment, there is, typically, about 90 to 98% Si—H groups for each unit of the polyhydrogensilsesquioxane resin main chain.

The term "latent" when use in connection to components optionally present in the present compositions refer to a property of being activated during processing of the compositions or of the resin, for example by light. Thus, latent acids and latent bases in the compositions can be activated when being exposed to light.

In one embodiment, the present materials are cured without photocatalyst(s).

In one embodiment, patterning of the present materials by using EUVL is carried out in the absence of photoinitiator(s).

In one embodiment, the present polyhydrogensilsesquioxane resins or resin compositions are free from photoinitiator(s).

Embodiments of the present invention relates also to the use of the functional polyhydrogensilsesquioxane solutions to cast coatings on semiconductor substrates to form patterns through subsequent bake, irradiation and development steps. In particular, the invention relates to the ability to control the microstructure of the resin in such way it is industrially feasible and solves the drawbacks of prior art. For instance, the invention relates to the ability to control the amount of carbon-carbon unsaturated bond in the polyhydrogensilsesquioxane resin, which is highly desirable to obtain highly sensitive coating for application in EUVL.

One embodiment comprises
  providing a polyhydrogensilsesquioxane resist composition comprising at least of 50 mol-% of siloxy repeating units containing a Si—H and up to 30 mol-% of siloxy repeating units having an unsaturated hydrocarbyl radical, the composition having a silicon content of more than 35% by weight,
  forming the composition into a layer or a coating on a substrate; and
  patterning it, in the absence of a photoinitiator, by extreme ultraviolet beam lithography using radiation of light at a wavelength between 1 and 200 nm or at a wavelength of 13.5 nm (or 13.5 nm or less), wherein the composition preferably contains carbon-carbon unsaturated bonds and halogen and optionally a solubility-enhancer.

According to an embodiment, the present technology relates to a composition suitable for formation of an irradiation curable siloxane layer on a substrate, said composition comprising a siloxane polymer containing SiO moieties, a plurality of reactive sites distributed along the polymer, and a first SiH portion, and an intermediate aromatic and non-aromatic portion, a third organosilicon portion containing a unsaturated bond, a fourth organosilicon portion containing halogen groups, and a fifth organosilicon portion containing a functional group enhancing solubility to developer wherein the polymer has a weight average molecular weight of from 500 to 50000 g/mol, and the composition preferably further comprising an acid and/or base and a solvent.

According to a preferred embodiment, the present invention relates to a composition suitable for the production of a coating formulation that can be cast on substrates, and wherein the coating on the substrate can be patterned by irradiation of a patternable film and in which the coating is represented by a general formula (I)

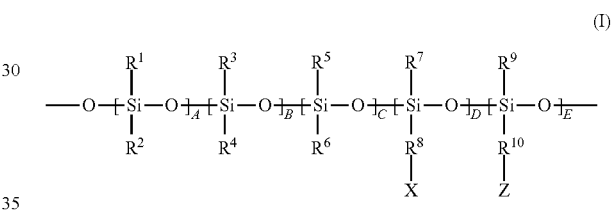

In Formula I, the symbols A, B, C, D and E each represent an integer independently selected from 1 to 1000, Z stands for functional group and X stands for a halogen atom.

Further, in Formula I each $R^1$ to $R^{10}$ independently stand for hydrogen or hydrocarbyl radicals, in particular $R^1$ stands for hydrogen; $R^6$ stands for hydrocarbyl radicals containing unsaturated moieties; and each $R^2$ to $R^5$ and $R^7$ to $R^{10}$ independently stands for hydrogen or a hydrocarbyl radical. In embodiments, $R^1$ may stand for hydrogen; $R^6$ for hydrocarbyl radicals containing unsaturated moieties; and each $R^2$ to $R^5$ and $R^7$-to $R^{10}$ stands for a hydrocarbyl radical.

In the present context, the term "unsaturated moieties" stands for structures which exhibit double or triple bonds, in particular between carbon atoms. Such bonds are referred to as "unsaturated bonds". The unsaturated moieties can contain one or several unsaturated bonds. The unsaturated bonds can be conjugated or non-conjugated.

Typically, in one embodiment, an unsaturated moiety contains at least one ethylenically unsaturated bond. Examples of unsaturated moieties include groups or structures containing a double or triple bond, such as an alkenylene group, an aryl group, an aralkyl group, a halogenated aryl group, a halogenated aralkyl group, an alkenyl group, an alkoxyalkyl group, an alkoxyaryl group, an acyloxyaryl group, or a combination of them. Each of $R^1$ to $R^{10}$ may also stand for, or contain, one or more moieties selected from alkylene groups, cycloalkylene groups, halogenated alkyl and alkylene groups and alkoxylalkyl groups.

Each of the moieties—in particular of the unsaturated moieties—may, of course, also contain substitutents, typically selected from the group of halides, alkoxy groups, hydroxyl groups, thiol groups, ester groups, oxo groups, ketone groups, carboxylic acid groups, amines and amides.

Specific examples of unsaturated moieties include vinyl, vinyl ethers, acrylate, alkacrylate, allyl, norbornylene, and combinations thereof.

Further, unsaturated moieties are examined below in conjunction with the various precursors.

"Alkoxy" and "alkyl", "alkylene", and "alkenylene" groups are linear or branched groups derived from alkanes comprising 1 to 12 carbon atoms, typically 1 to 10 carbon atoms. In embodiments of the present technology, alkoxy and alkyl are preferably linear or branched groups, in particular lower alkoxy and lower alkyl groups. Such groups contain 1 to 6, in particular 1 to 4 carbon atoms.

"Cycloalkylene" groups comprise at least 3, preferably at least 4, and in particular at least 5 carbon atoms and up to 20 carbon ring atoms.

"Aryl" bears the conventional meaning of a functional group or substituent derived from an aromatic ring, usually an aromatic hydrocarbon, such as phenyl and naphthyl or antracenyl. The aryl groups typically contain 1 to 5 aromatic rings, which can be fused or partially fused.

The above composition is obtained by hydrolyzing a first monomeric hydrogen containing silicon compound having at least one hydrolysable group attached to the silicon ("Precursor A") with optionally a second monomeric silicon compound having at least one hydrocarbyl radical, and at least one hydrolyzable group attached to the silicon atom of the compound i.e. ("Precursor B"), a third monomeric silicon compound having at least one functional group containing unsaturated bonds and at least one hydrolyzable group attached to the silicon atom of the compound ("Precursor C"), optionally a fourth monomeric silicon compound having at least one hydrolysable group and at least one halogen-containing group ("Precursor D")

optionally a fifth monomeric silicon compound having at least one functional group and at least one hydrolyzable group attached to the silicon atom of the compound to form a siloxane material, wherein the functional group enhances dissolution to a developer ("Precursor E") and formulating the siloxane material into a composition, in particular stable composition, in a suitable solvent system.

The ratio of the precursors used in the present invention can vary. Precursor A can be used in 50-100 mol-%, Precursor B can be used in 0-20 mol-%, Precursor C can be used in 0.1-20 mol-%, typically 1-10 mol-%, Precursor D can be used in 0-20 mol-%, and Precursor E can be used in 0-10 mol-%. The siloxane composition can be obtained by carrying out the hydrolysis and condensation in the same reaction vessel or separately in specified portions or each precursor independently.

In one embodiment, the Precursor A is used at a molar ratio of Precursor A to Precursor C of 99:1 to 80:20 moles.

The present invention is particularly well suited for the production of compositions comprises a poly(organosiloxane) obtained by hydrolyzing a first silicon compound having the general formula II

  (II)

In the composition, a is an integer of 1 or 2 while b is an integer of 2 or 3. $R^1$ denotes a hydrogen atom and $R^2$ denotes a hydrolysable group which can independently be selected from hydroxyl, alkoxy, acyloxy and halogen. In the meaning of "halogen", each of the hydrolysable groups preferably and independently stands for chlorine, iodine, fluorine, or bromine. In the meaning of "alkoxy", each of the hydrolysable groups preferably and independently stands for methoxy, ethoxy, n-propoxy, i-propoxy, butoxy, sec-butoxy, tert-butoxy. In the meaning of "acyloxy", each of the hydrolysable groups preferably and independently stands for acetoxy, acryloxy, or methacryloxy. Specific examples of such precursors are triethoxysilane (HTEOS), trimethoxysilane (HTMOS), diethoxysilane and trichlorosilane. In some cases $R^2$ may also be an organic radical, such as methyl, ethyl, propyl, vinyl. Specific examples of such precursors include as methyldimethoxysilane, methyldiethoxysilane, methyldichlorosilane, vinyldimethoxysilane, vinyldiethoxysilane and vinyldichlorosilane.

The present invention also relates to the compositions comprising a copoly(organosiloxane) obtained by hydrolyzing the first silicon compound having the general formula II, with a precursor having the general formula III

  (III)

Wherein $R^3$ and $R^4$ can be independently selected from an alkyl group, an aryl group, an aralkyl group, a halogenated alkyl group, a halogenated aryl group, a halogenated aralkyl group, an alkenyl group, an organic group having an epoxy group, an acryloyl group, a methacryloyl group, a mercapto group, an alkoxyaryl group, an acyloxyaryl group, an isocyanurate group, a hydroxy group, a cyclic amino group, or a cyano group, or a combination of them. $R^{21}$ can have the same meaning as $R^2$ above. In particular, $R^{21}$ and $R^3$ may also be an alkoxy group, an acyloxy group, or a halogen group. c is an integer of 0 to 1, and n is an integer of 2 to 4, and d is an integer of 0 to 1, and the total value of m+n+o may not exceed 4.

The present invention further relates to the compositions comprising a copoly(organosiloxane) obtained by hydrolyzing the first silicon compound having the general formula II, with a precursor having the general formula IV

  (IV)

wherein $R^5$ is independently selected from an alkyl group, an aryl group, an aralkyl group, a halogenated alkyl group, a halogenated aryl group, a halogenated aralkyl group, an alkenyl group, an organic group having an epoxy group, a mercapto group, an alkoxyaryl group, an acyloxyaryl group, a hydroxy group, a cyclic amino group, or a cyano group, or a combination of them, $R^6$ is a functional group containing a double or triple bond present in an alkyl group, an aryl group, an aralkyl group, a halogenated alkyl group, a halogenated aryl group, a halogenated aralkyl group, an alkenyl group, an alkoxyalkyl group, an alkoxyaryl group, an acyloxyaryl group, or a combination of them. $R^{22}$ can have the same meaning as $R^2$ above. In particular $R^{22}$ can stand for an alkoxy group, an acyloxy group, or a halogen group. e is an integer of 0 to 1, n is an integer of 1 to 3, and f is an integer of 0 to 2, and the total value of e+n+f is 4 or less.

The present invention finally relates to the compositions comprising a copoly(organosiloxane) obtained by hydrolyzing the first silicon compound having the general formula II, with a precursor having the general formula V

  (V)

wherein X is a halogen group, $R^7$ is independently selected from an alkyl group, an aryl group, an aralkyl group, a halogenated alkyl group, a halogenated aryl group, a halogenated aralkyl group, an alkenyl group, an organic group having an epoxy group, a mercapto group, an alkoxyaryl group, an acyloxyaryl group, a hydroxy group, a cyclic amino group, or a cyano group, or a combination of them, $R^8$ is a spacer group covalently bound to both X and Si and can be independently selected from a bivalent group derived from an alkyl group, an aryl group, an aralkyl group, a halogenated alkyl group, a halogenated aryl group, a halogenated aralkyl group, an alkenyl group, an alkoxyaryl group, an acyloxyaryl group, or a combination of them. $R^{23}$ can have the same meaning as $R^2$ above. In particular, $R^{23}$ can be an alkoxy group, an acyloxy group, or a halogen group. g is an integer of 0 to 1, n is an integer of 1 to 3, and h is an integer of 0 to 1, and the total value of g+n+h is 4 or less. In the structure of Formula (V), h denotes the value that the spacer group $R^8$ can encompass and is an integer equal to or greater than 1.

The present invention finally relates to the compositions comprising a copoly(organosiloxane) obtained by hydrolyzing the first silicon compound having the general formula II, with a precursor having the general formula VI

$$R^9{}_i-SiR^{24}{}_n-R^{10}{}_j-Z^y \qquad (VI)$$

wherein Z is a group selected from hydroxy, carboxylic acid, mercapto, amine or its salt, or a quaternary ammonium salt facilitating solubility in aqueous developers, and $R^9$ is independently selected from an alkyl group, an aryl group, an aralkyl group, a halogenated alkyl group, a halogenated aryl group, a halogenated aralkyl group, an alkenyl group, an organic group having an epoxy group, a mercapto group, an alkoxyaryl group, an acyloxyaryl group, a hydroxy group, a cyclic amino group, or a cyano group, or a combination of them, $R^{10}$ is a spacer group covalently bound to both Z and Si and can be independently selected from a bivalent group derived from an alkyl group, an aryl group, an aralkyl group, a halogenated alkyl group, a halogenated aryl group, a halogenated aralkyl group, an alkenyl group, an alkoxyaryl group, an acyloxyaryl group, or a combination of them. $R^{24}$ can have the same meaning as $R^2$ above. In particular, $R^2$ is an alkoxy group, an acyloxy group, or a halogen group. i is an integer of 0 to 1, n is an integer of 1 to 3, and j is an integer of 0 to 2, and the total value of i+n+j is 4 or less. In the structure of Formula (VI), j denotes the value that the spacer group $R^{10}$ can encompass and must be equal or greater to 1.

One embodiment comprises hydrolyzing a first silicon compound having the general formula II, wherein the symbols a, b, $R^1$ and $R^2$ have the same meaning as above in formula II, with at least one second compound according to one of general formulas III to VI, and with at least one third compound according to one of general formulas III to VI, said third compound being different from said second compound.

One embodiment comprises hydrolyzing a first silicon compound having the general formula II, wherein the symbols a, b, $R^1$ and $R^2$ have the same meaning as above in formula II, with at least one second compound according to one of general formulas III to VI, with at least one third compound according to one of general formulas III to VI, and with at least one fourth and optionally at least one fifth compound according to one of general formulas III to VI, said third, fourth and optionally fifth compounds being different from said second compound and optionally mutually different.

Specific examples of precursor (III) include but are not limited to tetramethoxysilane, tetrachlorosilane, tetraacetoxysilane, tetraethoxysilane (TEOS), tetra-n-propoxysilane, tetraisopropoxysilane, tetra-n-butoxysilane, methyltrimethoxysilane, methyltriethoxysilane, methyltrichlorosilane, methyltriacetoxysilane, methyltripropoxysilane, methyltributoxysilane, methyltriphenoxysilane, methyltribenzyloxysilane, ethyltrimethoxysilane, ethyltriethoxysilane, phenyltrimethoxysilane, phenyltrichlorosilane, phenyltriacetoxysilane, phenyltriethoxysilane, γ-mercaptopropyltrimethoxysilane, γ-mercaptopropyltriethoxysilane, β-cyanoethyltriethoxysilane, dimethyldimethoxysilane, phenylmethyldimethoxysilane, dimethyldiethoxysilane, dipropyldiethoxysilane, diphenyldimethoxysilane, phenylmethyldiethoxysilane, dimethyldiacetoxysilane, γ-mercaptopropylmethyldimethoxysilane, γ-mercaptomethyldiethoxysilane, glycidoxymethyltrimethoxysilane, glycidoxymethyltriethoxysilane, α-glycidoxyethyltrimethoxysilane, α-glycidoxyethyltriethoxysilane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyltriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, β-(3,4-epoxycyclohexyl)ethyltripropoxysilane, β-(3,4-epoxycyclohexyl)ethyltributoxysilane, β-(3,4-epoxycyclohexyl)ethyltriphenoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, β-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, and phenylsulfonylaminopropyltriethoxysilane.

Specific examples of precursor (IV) are vinyltrimethoxysilane, vinyltrichlorosilane, vinyltriacetoxysilane, vinyltriethoxysilane, methylvinyldimethoxysilane, methylvinyldiethoxysilane, dimethylvinylmethoxysilane allyltrimethoxysilane, allyltrichlorosilane, allyltriacetoxysilane, allyltriethoxysilane, allylmethyldimethoxysilane, allylmethyldiethoxysilane, 3-butenyltrimethoxysilane, styrylethyltriethoxysilane, styrylethyltrimethoxysilane, γ-methacryloxypropyltrimethoxysilane, γ-methacryloxypropylmethyldimethoxysilane, γ-methacryloxypropylmethyldiethoxysilane, (methacryloxymethyl)methyldiethoxysilane, (methacryloxymethyl)methyldimethoxysilane, methacryloxymethyltriethoxysilane, methacryloxymethyltrimethoxysilane, methacryloxypropyltrichlorosilane, methacryloxypropyltriethoxysilane, methacryloxypropyltriisopropoxysilane, 3-acrylamidopropyltrimethoxysilane, acryloxymethyltrimethoxysilane, 3-acryloxypropyltrimethoxysilane, 3-acryloxypropylmethyldimethoxysilane, 3-acryloxypropylmethyldiethoxysilane, 3-acryloxypropyldimethylmethoxysilane, 3-acryloxypropyldimethylethoxysilane, acrylamidopropyltriethoxysilane, acrylamidopropyltrichlorosilane, acryloxymethyl(phenylethyl)trimethoxysilane, methacrylamidopropyltriethoxysilane, methacrylamidopropyltrichlorosilane, [2-(3-cyclohexenyl)ethyl]trimethoxysilane, [2-(3-cyclohexenyl)ethyl]triethoxysilane, [2-(3-cyclohexenyl)ethyl]trichlorosilane, [2-(3-cyclohexenyl)ethyl]methyldimethoxysilane, [2-(3-cyclohexenyl)ethyl]methyldichlorosilane (5-bicyclo[2.2.1]hept-2-enyl)triethoxysilane, (5-bicyclo[2.2.1]hept-2-enyl)trimethoxysilane, (5-bicyclo[2.2.1]hept-2-enyl)methyldiethoxysilane, (5-bicyclo[2.2.1]hept-2-enyl)ethyldiethoxysilane, (5-bicyclo[2.2.1]hept-2-enyl)dimethylmethoxysilane, (5-bicyclo[2.2.1]hept-2-enyl)trichlorosilane, (5-bicyclo[2.2.1]hept-2-enyl)methyldichlorosilane, (5-bicyclo[2.2.1]hept-2-enyl)dimethylchlorosilane.

Specific examples of precursor (V) are chloromethyltrimethoxysilane, chloromethylmethyldichlorosilane, chloromethylmethyldimethoxysilane, chloromethyltrichlorosilane, chloromethyltriethoxysilane, 2-chloroethylmethyldimethoxysilane, 2-chloroethylmethyldichlorosilane, 2-chloroethyltrimethoxysilane, 2-chloroethyltrichlorosilane, -chloroethylmethyldimethoxysilane, 2-chloroethylmethyldichlorosilane, 3-chloropropyltrimethoxysilane, 3-chloropropyltriethoxysilane, 3-chloropropyltriacetoxysilane, chloromethyltrimethoxysilane, chloromethyltriethoxysilane, 3-chloropropylmethyldimethoxysilane, 3-chloropropylmethyldiethoxysilane, bis(chloromethyl)dichlorosilane, bis(chloromehyl)methylchlorosilane, bis(chloromethyl)dimethoxysilane, bis(chloromehyl)methylmethoxysilane, bis(chloromehyl)diethoxysilane, bis(chloromehyl)methylethoxysilane, bis(3-chloropropyl)dichlorosilane, chlorophenylmethyldimethoxysilane, chlorophenyltrimethoxysilane, chlorophenyltriethoxysilane, chlorophenyltrichlorosilane, ((chloromethyl)phenylethyl)methyldimethoxysilane, ((chloromethyl)phenylethyl)trimethoxysilane and similar compounds where chloro groups is replaced with equivalent bromo or iodo groups. Specific examples in addition to above: 4-bromobutyltrimethoxysilane, 4-bromobutyltrichlorosilane, 2-bromoethyltrimethoxysilane, 5-bromopentyltrimethoxysilane, bromophenyltrimethoxysilane. Examples of precursor (V) also include linear, branched, cyclic and aromatic and alkylaromatic compounds where one or more hydrogen atoms areis replaced with halogen atoms (one or more). Specific examples of these include trifluoropropyltrimethoxysilane, trifluoropropylmethyldimethoxysilane, trifluoropropyltriethoxysilane, nonafluorohexyltrimethoxysilane, nonafluorohexylmethyldimethoxysilane 1,2-dibromoethyltrimethoxysilane, 1,2-dibromoethyltrichlorosilane, pentafluorophenyltrimethoxysilane, pentafluorophenyltriethoxysilane, pentafluorophenyltrichlorosilane, bis(pentafluorophenyl)dimethoxysilane, 4-bromo-3,3,4,4-tetrafluorobutyltrimethoxysilane.

Specific examples of precursor (VI) are 3,3,3-trifluoropropyltrimethoxysilane, 4-acetoxyphenylethyltrimethoxysilane, 4-acetoxyphenylethyltriethoxysilane 4-(acetoxyphenylethyl)methyldichlorosilane, 4-(acetoxyphenylethyl)methyldimethoxysilane, 4-(acetoxyphenylethyl)methyldiethoxysilane, 2-(carbomethoxy)ethyltrimethoxysilane, 2-(carbomethoxy)ethylmethyldimethoxysilane, 2-(carbomethoxy)ethyltrichlorosilane, 2-(carbomethoxy)ethylmethyldichlorosilane, triethoxysilylpropylcarbamate, triethoxysilylpropylmaleamic acid, N-(3-triethoxysilylpropyl)-4-hydroxybutyramide, N-(3-triethoxysilylpropyl)gluconamide, (3-triethoxysilyl)propylsuccinic anhydride, ureidopropyltriethoxysilane, ureidopropyltrimethoxysilane, 3-hydroxy-3,3-bis(trifluoromethyl)propyl triethoxysilane, 4-(methoxymethoxy)trimethoxysilylbenzene and 6-(methoxymethoxy)-2-(trimethoxysilyl)naphthalene.

One embodiment comprises using HTEOS (HSKOC$_2$H$_5$)$_3$) and a silicon precursor containing unsaturated hydrocarbyl radicals or HTEOS (HSKOC$_2$H$_5$)$_3$) and a silicon precursor containing unsaturated hydrocarbyl radicals in a mixture of other hydrolyzable silanes, which are subjected to a hydrolytic/condensation reaction, for making partially condensed polyhydrogensilsesquioxane resins.

According to one embodiment, the hydrolysis and polymerization is carried out completely without solvents, or it is carried out in organic solvents, optionally protic organic solvents. Examples of solvents include alcohols, esters, ketones and ethers. Specific, suitable solvents are acetone, ethyl methyl ketone, methanol, ethanol, isopropanol, butanol, methyl acetate, ethyl acetate, propyl acetate, butyl acetate and tetrahydrofuran. Particularly suitable solvents are ketones and ethers, particularly where certain stabilizing effect through coordination with the silicon atoms during hydrolysis is present. Such examples are ethyl methyl ketone, methyl tetrahydrofurfuryl ether and ethyl tetrahydrofurfuryl ether.

Controlled hydrolysis of the monomers is obtained by addition of an acid or base solution with molar ratio ranging from 0.0001 M to 1 M. Organic or inorganic acid can be used in the synthesis. Inorganic acids such as nitric acid, sulfuric acid, hydrocholoric acid, hydriodic acid, hydrobromic acid, hydrofluoric acid, boric acid, perchloric acid, carbonic acid and phosphoric acid can be used. Preferably, nitric acid or hydrochloric acid is used due to their low boiling point, which makes purification of product simple. In another option, various organic acids are used instead of inorganic acid. The organic acids can be selected from the group of carboxylic acid, sulfonic acid, alcohol, thiol, enol, and phenol groups and combinations thereof. Specifically, methanesulfonic acid, acetic acid, ethanesulfonic acid, toluenesulfonic acid, formic acid, or oxalic acid can be employed. Bases used in the synthesis may similarly be inorganic or organic. Typical inorganic bases and metal hydroxides, carbonates, bicarbonates and other salts that yield an alkaline water solution. Examples of such materials are sodium hydroxide, potassium hydroxide, cesium hydroxide, calcium hydroxide, sodium carbonate, and sodium bicarbonate. The organic bases may also comprise a larger group consisting of metal salts of organic acids (such as sodium acetate, potassium acetate, sodium acrylate, sodium methacrylate, sodium benzoate), or linear or branched or cyclic alkylamines (such as diaminoethane, purtescine, cadaverine, triethylamine, butylamine, dibutylamine, tributylamine, piperidine) amidines and guanidines (such as 8-diazabicyclo(5.4.0)undec-7-ene, 1,1,3,3-tetramethylguanidine, 1,5,7-triazabicyclo[4.4.0]-dec-5-ene), phosphazanes (such as P$_1$-t-Bu, P$_2$-t-Bu, P$_4$-t-Bu), and quarternary ammonium compounds (such as tetramethylammonium hydroxide, tetraethylammonium hydroxide, tetrabutylammonium hydroxide).

The temperature of the reaction mixture during the hydrolysis and condensation process can be varied in the range from −30 to 170° C. Lower reaction temperatures provide improved control of the reaction but at the cost of long reaction times, while excessively high temperatures may make the process too fast for adequate control. Thus, a reaction time of 1-48 h at a temperature of 0-100° C. is preferred; a reaction time of 2-24 h, at said temperature range, is even more preferred. Using appropriate conditions, the method according to the present invention yields a partially cross-linked, optionally carbon-carbon unsaturated bond containing organosiloxane polymer in an organic solvent system, said polymer having a weight average molecular weight of about 5,000 to 100,000 g/mol, in particular about 1,000 to 50,000 g/mol, measured against polystyrene standards.

Another embodiment of the invention is that the solvent in which hydrolysis and polymerization is carried out, is after polymerization changed for a solvent that provides the material better coating performance and product storage properties though some form of stabilization. Such stabilizing organic solvent system is formed by an organic ether optionally in mixture with other co-solvent or co-solvents. The organic ether is a linear, branched or cyclic ether comprising generally 4 to 26 carbon atoms and optionally other functional groups, such as hydroxyl groups. Particularly suitable examples are five and six membered cyclic ethers, which optionally bear substituents on the ring, and ethers, such as (C1-20) alkanediol (C1-6) alkyl ethers. Examples of said alkanediol alkyl ethers are propylene glycol monomethyl ether, propylene glycol dimethyl ether, propylene glycol n-butyl ether, dipropylene glycol monomethyl ether, dipropylene glycol. dimethyl ether, dipropyleneglycol n-butyl ether, tripropylene glycol monomethyl ether and mixtures thereof. Particularly preferred examples of the present ethers are methyl tetrahydrofurfuryl ether, tetrahydrofurfuryl alcohol, propylene glycol n-propyl ether, dipropylene glycol dimethyl ether, propylene glycol n-methyl ether, propylene glycol n-ethyl ether and mixtures thereof. The stabilizing solvent system consists of a solvent comprising of the ether of this kind alone, or of a mixture-of such ether with a typical reaction medium of the hydrolyzation or other solvents such as propylene glycol monomethyl ether acetate. The proportion of the ether is, in such a case, about 10 to 90 wt-%, in particular about 20 to 80 wt-% of the total amount of the solvent.

The solid content of the radiation sensitive formulation consisting of selected solvents and the resin material is in the range of 0.1% to no more than 50%; most preferably in the range of 0.5% to 10%. The solid content (or polymer content) is used to adjust the resultant film thickness during the coating process. To improve the coating performance in terms of coating uniformity, different surfactants such as silicone or fluoro surfactant can be used to lower surface tension of the silanol-containing polyhydrogensilsesquioxane formulation coating. The use of such surfactants may improve coating quality if needed. The amount of surfactant is in a range of 0.001% to no more than 10% by mass compared to silanol-containing polyhydrogensilsesquioxane amount.

It has been found that the introduction of carbon-carbon unsaturated bond moieties (as precursor III) in the polyhydrogensilsesquioxane resin greatly facilitates the pattern forming ability of the coatings compared to HSQ resins. During EUV or similar irradiation method such as e-beam, H* radicals are likely formed from SiH. The formed radicals undergo transformations which lead to the crosslinking of the film. As a result of this, the exposed areas lose their solubility to the aqueous developer. The use of precursors containing unsaturated bonds provide an alternative crosslinking mechanism and this facilitates the crosslinking of the polyhydrogensilsesquioxane resins. The unsaturated bonds may react with the formed radials from SiH.

Figure 4:
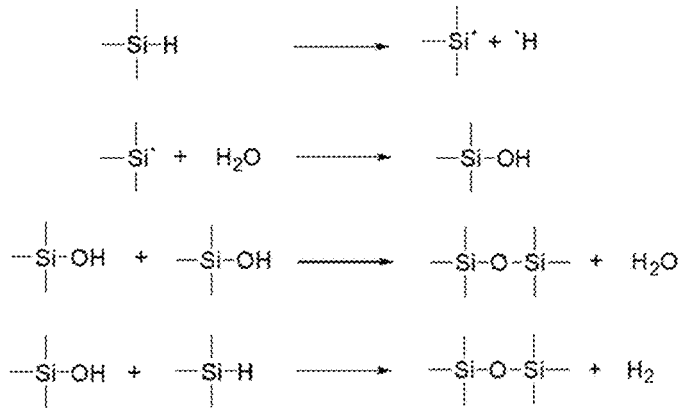
FIG. 4 shows schematically the EUV crosslink mechanism of carbon-carbon double bond containing polyhydrogensilsesquioxane of one embodiment.
Figure 4:
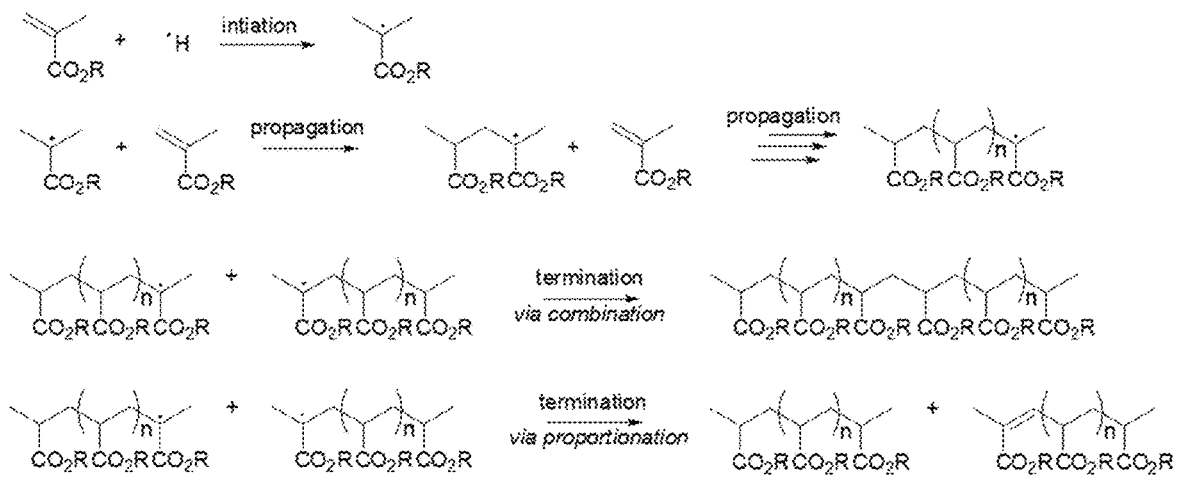

FIG. 4 which shows an embodiment, in which EUV patterning mechanism of the carbon-carbon unsaturated bond containing polyhydrogensilsesquioxane, wherein polymerization of methacrylate-based compound is demonstrated.

Generally speaking, the presence of carbon-carbon unsaturated bonds in the material improves the crosslink of the polymer and thus enhances the sensitivity.

The coatings containing carbon-carbon unsaturated bonds exhibit increased sensitivity as a function of increased amount of the functional groups. As the result, a carbon-carbon unsaturated bond containing polyhydrogensilsesquioxane demonstrates higher sensitivity in EUV lithography compared to those without these carbon-carbon unsaturated bonds in the polymer structures. The effect has been demonstrated in the examples where increased amount of the functional organosilicon precursor containing carbon carbon unsaturated bonds show increased sensitivity, i.e. decreased dose to pattern the resin. Thus, the functional polyhydrogensilsesquioxane resin composition can be adjusted to optimize the outcome of the lithographic patterning process.

In one embodiment, an amount of 1-30 mol-%, for example 2 to 20 mol-%, of an organosilicon precursor containing carbon-carbon unsaturated bonds in the resin composition is employed. Such an addition will increase the sensitivity.

The effect of the functional organosilicon precursor containing carbon-carbon unsaturated bonds was demonstrated by E-beam lithography and the scanning electron microscope (SEM) images of the patterns are presented in FIG. 5.

Examples 1-2 and Comparative Example 1 outline resin compositions with a 1.3% solid content which was used to cast a coating, irradiated with EUV and finally developed with 2.38% TMAH to obtain patterned image.

As seen in FIG. 5, high resolution SEM images of half pitches of 22 nm have been obtained. The required dose to obtain pattern decreased by 33% and 42%, respectively, when 2.5% and 5% MAPTMOS monomer was used in the syntheses (cf. Examples 1 and 2). By choice of different functional organosilicon precursor containing carbon-carbon unsaturated bonds the sensitivity could be further enhanced and the required dose to obtain pattern of Example 5 was 9% less when an acrylate based precursor was used instead of a methacrylate based precursor (FIG. 8). Similar results were also found by the use of functional organosilicon precursors containing a norborene moiety (Examples 6 and 7). This was further confirmed using EUV (FIG. 9).

Other organosilicon precursors containing carbon-carbon unsaturated bonds can be used in embodiments according to the present invention.

It has also been found out that the use of functional organosilicon precursor containing halogen atoms in a polyhydrogensilsesquioxane resin composition can yield a similar effect where the coated resin exhibits higher sensitivity to irradiation which leads to decreased doses applied in the exposure step in lithographic patterning of the coated resin (Example 4).

Further, it has been found that the combined use of functional organosilicon precursors containing carbon-carbon unsaturated bonds together with monomers in combination with functional organosilicon precursors containing halogen atoms contribute to an increased sensitivity to irradiation which leads to decreased dose requirements, as discussed in Example 3. Reference is also made to FIGS. 6 and 7.

Non-functional polyhydrogensilsesquioxane resin or traditional HSQ resins may exhibit scumming or residues between patterned lines or other shapes. In case of over exposure these residues develop to bridging of lines, i.e. the desired patterned lines are connected though an unwanted 'bridge'. Thus, methods to decrease bridging is needed, preferably so that the dose range is as wide as possible to permit a large process window.

Scumming, or residues between the lines, can be reduced by adding another functional organosilicon precursor to the polyhydrogensilsesquioxane resin composition. Such functional organosilicon precursors enhance the solubility of the resin into the developer. This has been demonstrated by Examples 10 and 11 (FIG. 11).

It is a surprising finding that a functional organosilicon precursor to the polyhydrogensilsesquioxane resin composition not only decreased the residues in the formed patterns, but also increased the process window for the resin.

Given that the cure mechanism predominately proceeds through a radical reaction mechanism, the scumming or bridging may also be addressed by addition of radical scavengers in the functional polyhydrogensilsesquioxane resin formulation. By addition of commonly known radical inhibitors or antioxidants, the residues could be reduced (Examples 12 and 13, as shown in FIG. 12).

The present invention contains one more finding related to stabilization of hydrolyzed solutions of organosilicon precursors. Hydrolysis of multifunctional organosilicon precursors, in the presence of acid or base catalysts, initiates a hydrolysis and condensation process that ultimately leads to crosslinked polymer network. Generally, this process is described as sol-gel materials. When an organosilicon precursor solution as such or as a part of a mixture with organic solvents is introduced to water in the presence of a catalyst, a hydrolysis and subsequent condensation process is initiated. Initially, the precursors hydrolyze and condense forming a 'sol', i.e. a material soluble in solvents or solvent combinations. As the condensation reactions proceed, a multifunctional precursor will yield a crosslinked network, which no longer is soluble. Such state is often referred as a 'gel' when a diluent in the form of a solvent is present.

Given that the plurality of compounds most preferable to use in this invention are multifunctional organosilicon precursors, it is of significant interest to provide means to reduce the rate of condensation reactions when the material is stored in its 'sol' state. It has been found that addition of organic acids surprisingly will lead to stabilizing effect. This stabilizing effect can be monitored by GPC. Addition of organic acids or diacids to a polyhydrogensilsesquioxane resin solutions have to our surprise significantly improved the stability of these (Examples 12 and 13).

Figure 2:
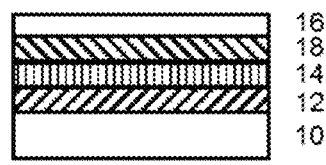
FIG. 2 shows in a schematic fashion, in side-view, the assembly of a four-layer lithography stack.

In certain embodiments, the present invention relates to the use of compositions described herein in the formation of patterns on a semiconductor substrate, as illustrated in FIGS. 1 and 2.

Thus, in a process of the present kind, typically a substrate surface 10 is coated with an organic underlayer 12, followed by coating and curing of an inorganic middle layer 14, which typically consist of a high silicon containing material. On top of this, a photoresist 16 is coated. After irradiation 30 using a wavelength of 193 nm a pattern is formed and developed. Such a combination of layers is frequently described in the literature as a 'tri-layer' stack, referring to the number of layers.

Subsequent pattern transfer etch processes can be applied to transfer the pattern formed on the photoresist to the substrate (FIG. 1). It is worth noting that the stack of various layers used in lithography can be higher than 3.

Another combination of layers is a four-layer stack wherein an organic underlayer 12 is first applied, followed by coating and curing of an inorganic middle layer 14, which typically consist of a high silicon containing material. On top of this, an organic bottom anti-reflective 18 layer is applied prior to a photoresist 16 which completes the four-layer stack (FIG. 2).

In photoresist patterning of the present kind, all described underlayers may not only be coated and cured but also be applied by gas phase deposition processes such as chemical vapor deposition (CVD), atomic layer deposition (ALD) and similar methods.

The same procedure can be applied to EUVL at 13.5 nm. However, due to absorption challenges, stochastic distribution of both photo acid and the photon irradiation, a commonly use CAR used in the process faces serious challenges, in particular related to the LER and LWR. Therefore, significant amount of interest has been directed to the use of inorganic photoresists which promise the stack simplification where both number of layers are reduced and the LER and LWR challenges are reduced. In most cases the inorganic resist consists of metal oxides of one or more compounds in the form of readily hydrolysable or hydrolyzed metal oxide precursors, and hydrogensilsesquioxanes. The benefits of these have been: metal oxide resist yield an unprecendented EUVL dose sensitivity while hydrogensilsesquioxane polymers give excellent resolution with low LER/LWR with very poor EUVL sensitivity. Thus, both methods have attributes which render them challenging to use in EUVL patterning processes. The present invention uses carbon-carbon unsaturated bonds and/or halogen containing siloxanes as the preferred method to achieve both stack simplification and the reduction of metals used in the patterning process.

Figure 3:
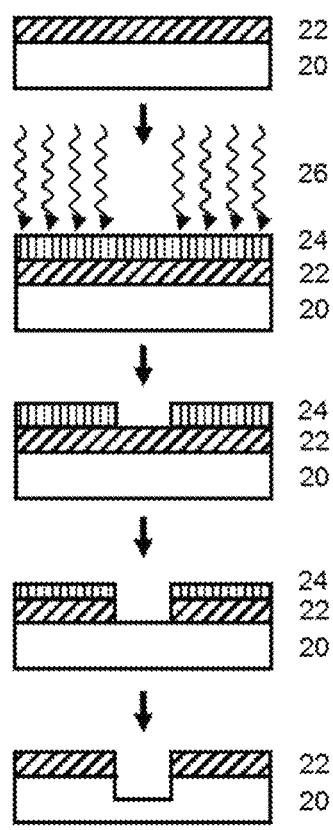
FIG. 3 shows, in side-view, patterning with carbon-carbon double bond containing polyhydrogensilsesquioxane resin according to one embodiment.

Reference is made to the embodiment shown in FIG. 3. In that embodiment, a substrate 20 is coated with a predominately organic coating 22 in the form of a spin on carbon or an amorphous carbon layer in EUV. The thin, patternable film according to the present invention 22 is based on carbon-carbon unsaturated bond and/or halogen and/or solubility enhancer containing polyhydrogensilsesquioxane resin 24. This coating is readily patternable by EUVL with high sensitivity compared to HSQ resins in the literature and significantly lower LER/LWR compared to CAR and inorganic resins described in the literature. In particular, the present invention provides a mean to high resolution patterning with a bilayer structure in the absence of metals which may be a significant advantage in producing fully functional transistor dies without significant yield losses.

Silicon containing materials have relatively low absorption to EUV. On the other hand, halogen containing resist may improve the EUV absorption to EUV and thus improve patterning result.

Desirable carbon-carbon unsaturated bond and solubility enhancer containing polyhydrogensilsesquioxane solutions, generally in non-aqueous solvent provide high resolution patterning in which the solutions have a high degree of stability for the formation of radiation patternable coatings with good radiation sensitivity. Desirable features of coatings formed with the carbon-carbon unsaturated bond and solubility enhancer containing polyhydrogensilsesquioxane solutions provide for superior direct patterning for the formation of a patterned silicon oxide coating. In embodiments of interest, exposure to radiation converts the irradiated coating material into a material that is resistant to removal with a developer composition such that it can be selectively removed. Thus, the coating can be negatively patterned. Selective removal of at least a portion of the coating material can leave a pattern where regions of coating have been removed to expose the underlying substrate. After development of the coating following irradiation, the patterned silicon oxide materials can be used for facilitating processing in device formation with excellent pattern resolution. The coating materials can be designed to be sensitive to selected radiation, such as extreme ultraviolet light, ultraviolet light and/or electron beams.

Furthermore, the precursor solutions can be formulated to be stable with an appropriate shelf life for commercial distribution. In the present context, the term "stable" in particular denotes a composition which will have a shelf life of at least 7 days, in particular at least 14 days, for example 21 days up to 48 months, typically 6 to 24 months, when stored at 5 to 30° C., in particular at room temperature, preferably in original, tightly sealed container.

The radiation sensitive coating material can be used as negative radiation patterning coating. In the negative patterning, exposure to radiation converts the irradiated coating material into a material that is more resistant to removal with a developer composition relative to the non-irradiated coating material. Selectively removal of at least a portion of the coating material leaves a pattern where regions have been removed to expose the underlying substrate.

The formation of integrated electronic devices and the like generally involves the patterning of the materials to form individual elements or components within the structures. This patterning can involve different compositions covering selected portions of stacked layers that interface with each other vertically and/or horizontally to induce desired functionality.

The various materials can comprise semiconductors, which can have selected dopants, dielectrics, electrical conductors and/or other types of materials.

To form high resolution patterns, radiation sensitive organic compositions can be used to introduce patterns, and the compositions can be referred to as resists since portions of the composition are processed to be resistant to development/etching such that selective material removal can be used to introduce a selected pattern.

Radiation with the selected pattern or the negative of the pattern can be used to expose the resist and to form a pattern or latent image with developer resistant regions and developer dissolvable regions. The radiation sensitive metal and silanol containing polyhydrogensilsesquioxane compositions described herein can be used for the direct formation of desired inorganic material structures within the device and/or as a radiation patternable inorganic resist that is a replacement for an organic resist. In either case, significant processing improvements can be exploited, and the structure of the patterned material can be also improved.

In one embodiment, resist film is exposed to light in the ultraviolet or, in particular extreme ultraviolet wavelength range, for example in the range from 1 to 200 nm, in particular about 13.5 nm (92 eV).

In one embodiment, the composition used for the resist film is free from photoinitiator.

Based on the examples presented in this invention, it is evident that the presence of solubility enhancer containing compound facilitates the dissolution of non-exposed areas or prevent reactions on non-exposed areas and thus improves the resolution and LER/LWR. Similarly, radical inhibitor or antioxidant additives prevent radicals formed in the exposed areas to unwantedly migrate to the non-exposed areas. Thus, lower LER/LWR can be achieved.

Certain embodiments comprise deposition of a carbon rich underlayer 22 on a surface 20 used in manufacturing of integrated circuits. The underlayer is deposited by gas phase processes such as CVD or by spin coat and cure. Then a composition as described herein is applied 24 yielding a predominately silicon and metal rich oxide coating which can be directly patterned by novel patterning techniques such as EUVL.

After application by spin coating or other suitable deposition methods for liquids, a prebake step is applied to remove the solvents and volatile compounds which are included in the coating material. This is necessary to avoid contamination in the manufacturing equipment. Prebake can be done at different temperatures and times depending on the boiling temperature of the solvents and volatile components. Usually, prebake can be done at 60° C. to 120° C. for a period of 30 seconds to no more than 30 minutes.

After the drying or prebake step, exposure of the coating to EUV light, electron beam or similar exposure method (26) through an optionally used mask is used to generate the patterns on the substrate. The dose needed to generate patterns is at minimum 10 mJ/cm$^2$ and at maximum 200 mJ/cm$^2$.

As noted previously, in embodiments of the present technology, a lower dose is preferred due to various reasons among which include a reasonable throughput in industrial application and addressing the RLS trade off.

A post exposure bake is optionally carried out after EUV exposure. This step can improve the crosslinking of the exposed regions which would lead to higher contrast of the resist. Post exposure bake can be done in a temperature of 80° C. to no more than 150° C. for a time ranging from 30 seconds to no more than 30 minutes.

Development is carried out to remove the unexposed region, thus obtaining designed pattern. During the development step, non-exposed regions of the resist 24 dissolves in the developer.

Aqueous base developer commonly used in the industry based on bases such as tetramethylammonium hydroxide, potassium hydroxide, sodium hydroxide with different mass ratio of 0.1% to 25% can be effectively used. The development is carried out by commonly known methods using a spray or puddle of the developer solution method to apply the developer. Alternatively, the substrate can be immersed in bath consisting of the developer.

A curing step to densify the exposed and developed pattern may be optionally carried out to obtain a further crosslinked material or to alter the shape of the resist pattern through process where the material exhibits some reflow. This step may result in higher etch resistance material compared to that of material prepared without the curing step. Curing can be done at 120° C. to 400° C. for 2 minutes to no more than 30 minutes. Curing can be done by heating the coating placed on a hot plate or in an oven.

Embodiments are represented by the following:

A functional polyhydrogensilsesquioxane resist composition in particular for extreme ultraviolet or electron beam lithography comprising at least of 50 mol-% of first siloxy repeating units containing a Si—H and up to 30 mol-% of third siloxy repeating units having an unsaturated hydrocarbyl radical, wherein the first siloxy repeating units are derived from trialkoxysilane monomers and the third siloxy repeating units are derived from 3-(alk)acryloxyalkyltrialkoxysilane monomers, the molar ratio of the first to the third units being 99:1 to 85:15.

A functional polyhydrogensilsesquioxane resist composition in particular for extreme ultraviolet or electron beam lithography comprising at least of 50 mol-% of first siloxy repeating units containing a Si—H and up to 30 mol-% of third siloxy repeating units having an unsaturated hydrocarbyl radical, wherein the first siloxy repeating units are derived from trialkoxysilane monomers and the third siloxy repeating units are derived from norbornene trialkoxysilane monomers, the molar ratio of the first to the third units being 99:1 to 85:15.

In the above embodiments, the alkoxy and alkyl groups are preferably derived from lower, linear or branched alkoxy and alkyl groups, containing 1 to 6, in particular 1 to 4 carbon atoms.

The following non-limiting examples illustrate embodiments.

EXAMPLES

Methods

Gel permeation chromatography data was collected on an Agilent 1260 Infinity LC equipped with Shodex KF columns (KF-G; KF-803L; KF-802; KF-801) connected in series. The detector and column temperature was held at 40° C. Flow rate of THF eluent was 1.0 ml/min.

E-beam lithography was carried out on a Vistec tool. The formulations are 1.3% solid content. The formulations were spin coated on silicon wafers via a spin coater with a spinning speed of 1500 rpm for 30 seconds. Soft bake was then carried out on a hot plate at temperature of 80° C. for 1 minute. The e-beam doses were varied from 100 to 900 $\mu C/cm^2$ at 100 kV and current of 1 nA. The development step was carried out by immersing the film in 2.38% TMAH solution for 1 minute. The film was then washed repeatedly three times with deionized water and finally dried with nitrogen gas.

EUV lithography: The polymer formulation of 1.3% solid content was spin coated on silicon wafers via a spin coater with a spinning speed of 1500 rpm for 30 seconds. Soft bake was then carried out on a hot plate at temperature of 80° C. for 1 minute. The film samples after soft bake were irradiated with a XIL-II EUV tool at Paul Scherrer Institute, Villigen, Switzerland. The doses were varied from 2 to 150 $mJ/cm^2$. The development step was carried out by immersing the film in 2.38% TMAH solution for 1 minute. The film was then washed repeatedly three times with deionized water and finally dried with nitrogen gas.

Example 1

Preparation of polymer solution with HTEOS:MAPTMOS=97.5:2.5 molar ratio

In one flask a mixture of 100 grams of triethoxysilane (HTEOS) and 3.88 grams of 3-methacryloxypropyltrimethoxysilane (MAPTMOS) monomers, was dissolved in 193.02 grams of methyl tetrahydrofurfurylether (MeOTHF). The HTEOS:MAPTMOS molar ratio is 97.5:2.5. A mixture of 48.26 grams of MeOTHF, 21.55 grams of deionized water (DIW) and 9.88 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 3945, Mn of 2047, and polydispersity of 1.93.

Example 2

Preparation of polymer solution with HTEOS:MAPTMOS=95:5 molar ratio

In one flask a mixture of 100 grams of triethoxysilane (HTEOS) and 7.96 grams of 3-methacryloxypropyltrimethoxysilane (MAPTMOS) monomers, was dissolved in 193.02 grams of methyl tetrahydrofurfurylether (MeOTHF). The HTEOS:MAPTMOS molar ratio is 95:5. A mixture of 48.28 grams of MeOTHF, 22.12 grams of deionized water (DIW) and 10.14 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 3052, Mn of 1690, and polydispersity of 1.81.

Comparative Example 1

Preparation of polymer solution with 100% triethoxysilane (HTEOS)-based polymer as reference In one flask a mixture of 100 grams of triethoxysilane (HTEOS) was dissolved in 193.02 grams of methyl tetrahydrofurfurylether (MeOTHF). A mixture of 48.26 grams of MeOTHF, 21.04 grams of deionized water (DIW) and 9.63 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 3311, Mn of 1669, and polydispersity of 1.98.

Testing of Polymers

The film samples were prepared from 1.3% solid polymer solutions by spin coating with a spinning speed of 1500 rpm for 30 seconds. Soft bake was carried out with temperature of 80° C. for 1 minute. The 2.38% TMAH solution was used as developer in e-beam lithography.

Evaluation of results. Scanning electron microscope images in Examples 1 and 2 demonstrate high resolution patterning using e-beam lithography (FIG. 5). Examples 1 and 2 showed clear improvements in sensitivity compared with the material prepared in Comparative Example 1. The required dose to obtain pattern decreased by 33% in Example 1 and 42% in Example 2 compared to the Comparative Example 1.

Example 3

Preparation of polymer solution with HTEOS:MAPTMOS:CI-TEOS=90:5:5 molar ratio

In one flask a mixture of 100 grams of triethoxysilane (HTEOS), 8.40 grams of 3-methacryloxypropyltrimethoxysilane (MAPTMOS), and 8.14 gram of 3-chloropropyltriethoxysilane (CI-TEOS) monomers, HTEOS:MAPTMOS:CI-TEOS molar ratio of 90:5:5, was dissolved in 214.47 grams of methyl tetrahydrofurfurylether (MeOTHF). A mixture of 53.60 grams of MeOTHF, 23.35 grams of deionized water (DIW) and 10.73 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 2630, Mn of 1500, and polydispersity of 1.75.

Testing of Polymers

Film samples were prepared from 1.3% solid polymer solutions by spin coating with a spinning speed of 1500 rpm for 30 seconds. Soft bake was carried out with temperature of 80° C. for 1 minute. The 2.38% TMAH solution was used as developer in e-beam lithography.

Evaluation of results. Scanning electron microscope images in Example 3 demonstrate high resolution patterning using e-beam lithography (FIG. 6). Resist prepared in Example 3 showed improved sensitivity compared with Examples 1-2 and Reference sample in Comparative Example 1 showed clear improvements in sensitivity compared with material prepared in Comparative Example 1. The required dose to obtain pattern decreased by 42% in Example 2 and 70% in Example 3 compared to the Comparative Example 1.

Example 4

Preparation of polymer solution with HTEOS:CI-TEOS=95:5 molar ratio

In one flask a mixture of 50 grams of triethoxysilane (HTEOS) and 3.86 gram of 3-chloropropyltriethoxysilane (CI-TEOS) monomers, HTEOS:CI-TEOS molar ratio of 95:5, was dissolved in 101.59 grams of methyl tetrahydrofurfurylether (MeOTHF). A mixture of 25.39 grams of MeOTHF, 11.06 grams of deionized water (DIW) and 5.07 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 2130, Mn of 1224, and polydispersity of 1.74.

Testing of Polymers

The film samples were prepared from 1.3% solid polymer solutions by spin coating with a spinning speed of 1500 rpm for 30 seconds. Soft bake was carried out with temperature of 80° C. for 1 minute. The 2.38% TMAH solution was used as developer in e-beam lithography.

Evaluation of results. Scanning electron microscope images in Example 4 demonstrate high resolution patterning using e-beam lithography (FIG. 7). Resist prepared in Example 3 showed improved sensitivity compared with Examples 1-2 and Reference sample in Comparative Example 1 showed clear improvements in sensitivity compared with material prepared in Comparative Example 1. The required dose to obtain pattern decreased by 70% in Example 4 compared to the Comparative Example 1.

Example 5

Preparation of polymer solution with HTEOS:APTMOS=90:10 molar ratio

In one flask a mixture of 25 grams of triethoxysilane (HTEOS) and 3.96 gram of 3-acryloxypropyltrimethoxysilane (APTMOS) monomers, HTEOS:APTMOS molar ratio of 90:10, was dissolved in 60.08 grams of methyl tetrahydrofurfurylether (MeOTHF). A mixture of 15.02 grams of MeOTHF, 5.84 grams of deionized water (DIW) and 2.67 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 2302, Mn of 1409, and polydispersity of 1.63.

Comparative Example 2

Preparation of polymer solution with HTEOS:MAPTMOS=90:10 molar ratio

In one flask a mixture of 25 grams of triethoxysilane (HTEOS) and 4.2 grams of 3-methacryloxypropyltrimethoxysilane (MAPTMOS) monomers, was dissolved in 60.08 grams of methyl tetrahydrofurfurylether (MeOTHF). The HTEOS:MAPTMOS molar ratio is 90:10. A mixture of 15.02 grams of MeOTHF, 5.84 grams of deionized water (DIW) and 2.67 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 2281, Mn of 1396, and polydispersity of 1.63.

Polymer Testing

Film samples were prepared by spin coating the polymer solutions, 1.3%, with a spinning speed of 1500 rpm for 30 seconds. Soft bake was then carried out with temperature of 80° C. for 1 minute. The 2.38% TMAH solution was used as developer in e-beam lithography.

Evaluation of results. Example 5 and Comparative Example 2 show that the acrylate functionality gives higher sensitivity compared to that of methacrylate-functionalized polymer resist. (SEM images of e-beam result in FIG. 8). The higher sensitivity can be explained by less steric hindrance of the acrylate group and thus higher activation energy compared to that of methacrylate group. The required dose to obtain pattern in Example 5 is 7% less than that of Comparative Example 2.

Example 6

Preparation of polymer solution with HTEOS:NorTEOS=95:5 molar ratio

In one flask a mixture of 30 grams of triethoxysilane (HTEOS) and 2.46 gram of norbornene triethoxysilane (NorTEOS) monomers, HTEOS:NorTEOS molar ratio of 95:5, was dissolved in 60.95 grams of methyl tetrahydrofurfurylether (MeOTHF). A mixture of 15.24 grams of MeOTHF, 6.64 grams of deionized water (DIVV) and 3.04 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 2960, Mn of 1424, and polydispersity of 2.08.

Example 7

Preparation of polymer solution with HTEOS:NorTEOS=90:10 molar ratio

In one flask a mixture of 10 grams of triethoxysilane (HTEOS) and 1.73 gram of norbornene triethoxysilane (NorTEOS) monomers, HTEOS:NorTEOS molar ratio of 90:10, was dissolved in 24.03 grams of methyl tetrahydrofurfurylether (MeOTHF). A mixture of 6.01 grams of MeOTHF, 2.34 grams of deionized water (DIW) and 1.07 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content.

Methyl ethyl ketone (MEK) was added four times to the polymer weight. The obtained polymer solution was filtered with 0.2-micron filter. Gel permeation chromatography data shows Mw of 3332, Mn of 1475, and polydispersity of 2.26.

Polymer Testing

Film samples were prepared by spin coating the polymer solutions, 1.3%, with a spinning speed of 1500 rpm for 30 seconds. Soft bake was then carried out with temperature of 80° C. for 1 minute. The 2.38% TMAH solution was used as developer in the EUV lithography.

Evaluation of EUV results. Examples 6-7 and Comparative Example 1 demonstrate the beneficial effect of incorporated norbornene functionality in the polymer resist. Addition of only few weight percentages can clearly eliminate the scumming issue and improve the LER (SEM images in FIG. 9). FIG. 9 shows e-beam result of 22 nm half pitch patterned lines obtained by EUVL using materials in a) Comparative Example 1 exhibiting LER=3.87 nm, b) Example 6 exhibiting LER=2.86 nm, and Example 7 exhibiting LER=2.77 nm; where the applied EUV doses were 77.5 mJ/cm$^2$, 97.5 mJ/cm$^2$ and 82.5 mJ/cm$^2$, respectively.

Example 8

Preparation of polymer solution with 1% maleic acid (MA)

Polymer solution prepared in Example 1 was added with 1% by weight (wt %) maleic acid. The obtained mixture can be further diluted with propylene glycol monomethyl ether acetate (PGMEA) solvent to obtain desired thickness formulation. The final formulation was filtered with 0.2-micron filter.

Example 9

Preparation of polymer solution with 2% MA

Polymer solution prepared in Example 1 was added with 2% by weight (wt %) maleic acid. The obtained mixture can be further diluted with propylene glycol monomethyl ether acetate (PGMEA) solvent to obtain desired thickness formulation. The final formulation was filtered with 0.2-micron filter.

Polymer Testing

Film samples were prepared by spin coating the polymer solutions, 1.3%, with a spinning speed of 1500 rpm for 30 seconds. Soft bake was then carried out with temperature of 80° C. for 1 minute. The 2.38% TMAH solution was used as developer in e-beam lithography. Evaluation of results. Examples 8-9 and Comparative Example 1 demonstrate the beneficial effect of added maleic acid in the polymer resist. E-beam result in FIG. 10 shows the stabilization of polymers with 1% and 2% MA.

Example 10

Preparation of polymer solution with HTEOS:HFIPTEOS=99:1 molar ratio

In one flask a mixture of 40 grams of triethoxysilane (HTEOS) and 0.92 gram of hexafluoroisopropyltriethoxysilane (HFIPTEOS) monomers, HTEOS:HFIPTEOS molar ratio of 99:1, was dissolved in 77.99 grams of methyl tetrahydrofurfurylether (MeOTHF). A mixture of 19.50 grams of MeOTHF, 8.50 grams of deionized water (DIW) and 3.89 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 4612, Mn of 1558, and polydispersity of 2.96.

Example 11

Preparation of polymer solution with HTEOS:HFIPTEOS=98:2 molar ratio

In one flask a mixture of 40 grams of triethoxysilane (HTEOS) and 1.85 gram of hexafluoroisopropyltriethoxysilane (HFIPTEOS) monomers, HTEOS:HFIPTEOS molar ratio of 99:1, was dissolved in 78.78 grams of methyl tetrahydrofurfurylether (MeOTHF). A mixture of 19.70 grams of MeOTHF, 8.59 grams of deionized water (DIW) and 3.93 grams of 0.01 M nitric acid was mixed and added to the above monomers' solution into three equal portions in 1.5 hours. After the completion of addition, the reaction was continued to mix for another 17 hours. Evaporation was carried out to obtain 15-25% of solid content. Methyl ethyl ketone (MEK) was added four times to the polymer weight. The obtained polymer solution was filtered with 0.2-micron filter. Gel permeation chromatography data shows Mw of 3762, Mn of 1247, and polydispersity of 3.02.

Testing of Polymers

The film samples were prepared from 1.3% solid polymer solutions by spin coating with a spinning speed of 1500 rpm for 30 seconds. Soft bake was carried out with temperature of 80° C. for 1 minute. The 2.38% TMAH solution was used as developer in EUV lithography.

Evaluation of results. Resist prepared in Examples 11 shows much less scumming issue in compared with that of polymer sample prepared in Comparative Example 1 (SEM images in FIG. 11). FIG. 11 shows 22 nm half pitch patterened lines obtained by EUVL using materials in a) Comparative Example 1 exhibiting LER=3.87 nm, b) Example 10 exhibiting LER=2.80 nm, and c) Example 11 exhibiting LER=3.05 nm; where applied EUV doses are 77.5 mJ/cm$^2$, 87.5 mJ/cm$^2$, and 107.5 mJ/cm$^2$, corresponding to a, b, and c, respectively.

Example 12

Polymer solution prepared in Comparative Example 1 was added with 1% by weight (wt %) maleic acid and 0.75 wt % pentaerythritol tetrakis(3-(3,5-di-tert-butyl-4-hydroxyphenyl)propionate) (I1010) inhibitor. The obtained mixture can be further diluted with propylene glycol monomethyl ether acetate (PGMEA) solvent to obtain desired thickness formulation. The final formulation was filtered with 0.2-micron filter.

Example 13

To the polymer solution prepared in Comparative Example 1 was added 1% by weight (wt %) maleic acid and 1.25 wt % pentaerythritol tetrakis(3-(3,5-di-tert-butyl-4-hydroxyphenyl)propionate) (I1010) inhibitor. The obtained mixture can be further diluted with propylene glycol monomethyl ether acetate (PGMEA) solvent to obtain desired thickness formulation. The final formulation was filtered with 0.2-micron filter.

Testing of Polymers

The film samples of polymers in Example 12-13 and Comparative Example 1 were prepared from 1.3% solid polymer solutions by spin coating with a spinning speed of 1500 rpm for 30 seconds. Soft bake was carried out with temperature of 80° C. for 1 minute. The 2.38% TMAH solution was used as developer in EUV lithography.

Evaluation of results. EUV result shows that the addition of small amount of I1010 improve scumming issue and thus provide better LER compared with Comparative Example 1 (FIG. 12). FIG. 12 shows 22 nm half pitch patterned lines obtained by EUVL using materials in a) Comparative Example 1 exhibiting LER=3.87 nm, b) Example 12 exhibiting LER=4.96 nm, and c) Example 13 exhibiting LER=3.00 nm, where the applied EUV doses are 77.5 mJ/cm$^2$, 87.5 mJ/cm$^2$, and 90 mJ/cm$^2$, corresponding to a, b, and c, respectively.

INDUSTRIAL APPLICABILITY

Generally, the present technology can be used in the semiconductor industry. For example, the present technology can be used for achieving complex circuitry in microelectronic devices in particular using lithographic processes, such as photolithographic processes. Embodiments comprising polyhydrogensilsesquioxane resins containing carbon-carbon unsaturated bond, halogen, and solubility-enhancer content. Adjustment of the carbon-carbon unsaturated bond, halogen, and solubility-enhancer content will make it possible to obtain a highly sensitive coating for application in extreme ultraviolet lithography.

ABBREVIATIONS

CAR chemically amplified resist
EBL electron beam lithography
EUV extreme ultraviolet (wavelength)
EUVL extreme ultraviolet lithography
GPC gel permeation chromatography
HSQ hydrogen silsesquioxane
LER line-edge roughness
LWR line width roughness
MAPTMOS 3-methacryloxypropyltrimethoxysilane
NIL nanoimprint lithography
PBL photon beam lithography
SEM scanning electron microscope
TEOS tetraethoxysilane
TMAH tetramethylammonium hydroxide

LIST OF REFERENCES

Non-Patent Literature
1. Okoroanyanwu, U. Molecular Theory of Lithography. (SPIE Press, 2015).
2. Gangnaik, A. S., Georgiev, Y. M. & Holmes, J. D. New Generation Electron Beam Resists: A Review. Chem. Mater. 29, 1898-1917 (2017).
3. Simone, D. D. et al. Progresses and Challenges of EUV Lithography Materials. J. Photopolym. Sci. Technol. 27, 601-610 (2014).
4. Higgins, C. D. et al. Resolution, line-edge roughness, sensitivity tradeoff, and quantum yield of high photo acid generator resists for extreme ultraviolet lithography. Jpn. J. Appl. Phys. 50, 1-8 (2011).
5. De Simone, D., Vesters, Y. & Vandenberghe, G. Photoresists in extreme ultraviolet lithography (EUVL). Adv. Opt. Technol. 6, 163-172 (2017).
6. Takeo Watanabe. Current status and prospect for EUV lithography. 2017 7th Int. Conf. Integr. Circuit, Des. Verif. 3-8 (2017).
7. Grigorescu, A. E. & Hagen, C. W. Resists for sub-20-nm electron beam lithography with a focus on HSQ: State of the art. Nanotechnology 20, 292001 (2009).
8. Yang, J. K. W. et al. Understanding of hydrogen silsesquioxane electron resist for sub-5-nm-half-pitch lithography. J. Vac. Sci. Technol. B Microelectron. Nanom. Struct. 27, 2622 (2009).

The invention claimed is:

1. A functional polyhydrogensilsesquioxane resist composition for extreme ultraviolet or electron beam lithography comprising at least 50 mol-% of siloxy repeating units containing a Si-H and siloxy repeating units having an unsaturated hydrocarbyl radical.

2. The composition according to claim 1, having a silicon content of more than 35% by weight of the total weight of the composition.

3. The composition according to claim 1, comprising an at least partially cross-linked organosiloxane polymer in a solvent, said polymer having a molecular weight of about 500 to 100,000 g/mol, measured against polystyrene standards.

4. The composition according to claim 1, wherein a liquid phase is formed by at least one organic solvent for the functional polyhydrogensilsesquioxane resist composition, optionally in mixture with water.

5. The composition according to claim 1, comprising a functional polyhydrogensilsesquioxane resin solution obtained by subjecting di- or trifunctional silanes to hydrolysis/condensation reactions with other hydrolysable silicon containing precursor(s) to form a functional polyhydrogensilsesquioxane.

6. The composition according to claim 5, wherein the di- or trifunctional, silicon precursor contains organic radicals containing one or more halogen atoms.

7. The composition according to claim 6, wherein the di- or trifunctional silicon precursor contains organic radicals that bear functionalities making the polymer more soluble into alkaline developer solutions.

8. The composition according to claim 1, wherein the composition is free from photoinitiator(s).

9. The composition according to claim 1, comprising a siloxane polymer containing SiO moieties, a plurality of reactive sites distributed along the polymer, and a first SiH portion, a second organosilicon portion containing an unsaturated hydrocarbyl radical, and an intermediate siloxy (SiO) portion that optionally is independently selected from non-functional and halogen containing hydrocarbyl radicals, wherein the polymer has a molecular weight of from 500 to 50,000 g/mol.

10. The composition according to claim 1, comprising a functional polyhydrogensilsesquioxane resin having the general formula (I)

$$-\text{O}-\underset{R^2}{\underset{|}{\overset{R^1}{\overset{|}{\text{Si}}}}}-\text{O}\Big]_A-\underset{R^4}{\underset{|}{\overset{R^3}{\overset{|}{\text{Si}}}}}-\text{O}\Big]_B-\underset{R^6}{\underset{|}{\overset{R^5}{\overset{|}{\text{Si}}}}}-\text{O}\Big]_C-\underset{\underset{X}{|}}{\underset{R^8}{\underset{|}{\overset{R^7}{\overset{|}{\text{Si}}}}}}-\text{O}\Big]_D-\underset{\underset{Z}{|}}{\underset{R^{10}}{\underset{|}{\overset{R^9}{\overset{|}{\text{Si}}}}}}-\text{O}\Big]_E- \quad (I)$$

wherein

A, B, C, D and E each represent an integer independently selected from 1 to 1000;

X stands for a halogen atom;

Z stands for functional group enhancing solubility to alkaline developers;

$R^1$ stands for hydrogen;

$R^6$ stands for a hydrocarbyl radical containing unsaturated moieties; and each $R^2$ to $R^5$ and $R^7$ to $R^{10}$ independently stands for hydrogen or hydrocarbyl radical.

11. The composition according to claim 1, which composition is suitable for the production of a coating formulation that can be cast on substrates, and wherein the coating on the substrate optionally is capable of being patterned by irradiation directly or using a mask.

12. A method of forming of a resist film by application of a composition according to claim 1, which is free from any photoinitiator, for forming a resist underlayer film onto a semiconductor substrate and baking the composition.

13. A method for producing a semiconductor device, comprising:

applying a resist underlayer film or several underlayer films onto a semiconductor substrate and baking the composition to form one or more resist underlayer films;

applying a composition according to claim 1 as a resist onto one or more resist underlayer films to form a resist film;

exposing the resist film to light;

after the light exposure, developing the resist film to form a resist pattern;

etching the resist underlayer film using the resist pattern; and fabricating the semiconductor substrate using the resist film thus patterned and the resist underlayer film thus patterned.

14. A method of producing a semiconductor device, comprising:

forming an organic underlayer film on a semiconductor substrate;

applying the composition according to claim 1 for forming a resist film onto the organic underlayer film and baking the composition to form a resist film;

exposing the resist film to light;

after the light exposure, developing the resist film to form a resist pattern;

etching the resist underlayer film using the resist pattern;

etching the organic underlayer film using the resist underlayer film thus patterned; and fabricating the semiconductor substrate using the organic underlayer film thus patterned.

15. The method according to claim 13, wherein the resist film is exposed to light in the range from 1 to 200 nm.

16. The method according to claim 13 wherein the composition according to claim 1 is free from a photoinitiator.

17. The composition according to claim 1, further comprising an acid and/or base and a solvent.

18. The composition according to claim 1, wherein the molar ratio of the siloxy repeating units containing a Si-H to the siloxy repeating units having an unsaturated hydrocarbyl radical is between 99:1 and 85:15.

19. A functional polyhydrogensilsesquioxane resist composition for extreme ultraviolet or electron beam lithography comprising at least 50 mol-% of siloxy repeating units containing a Si-H and up to 30 mol-% of siloxy repeating units having an unsaturated hydrocarbyl radical, further comprising a siloxane polymer containing SiO moieties, a plurality of reactive sites distributed along the polymer, and a first SiH portion, a second organosilicon portion containing an unsaturated hydrocarbyl radical, and an intermediate siloxy (SiO) portion that optionally is independently selected from non-functional and halogen containing hydrocarbyl radicals, wherein the polymer has a molecular weight of from 500 to 50,000 g/mol.

* * * * *